United States Patent
Kato et al.

(10) Patent No.: US 8,673,079 B2
(45) Date of Patent: *Mar. 18, 2014

(54) FILM DEPOSITION APPARATUS AND SUBSTRATE PROCESSING APPARATUS

(75) Inventors: Hitoshi Kato, Oshu (JP); Manabu Honma, Oshu (JP); Tomoki Haneishi, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 1201 days.

This patent is subject to a terminal disclaimer.

(21) Appl. No.: 12/550,453

(22) Filed: Aug. 31, 2009

(65) Prior Publication Data

US 2010/0050943 A1    Mar. 4, 2010

(30) Foreign Application Priority Data

Sep. 4, 2008   (JP) .................. 2008-227028

(51) Int. Cl.
*C23C 16/455*   (2006.01)
*C23C 16/00*    (2006.01)

(52) U.S. Cl.
USPC ......................... 118/719; 118/730

(58) Field of Classification Search
USPC .................................. 118/719, 730
See application file for complete search history.

(56) References Cited

U.S. PATENT DOCUMENTS

| | | |
|---|---|---|
| 3,636,916 A | 1/1972 | Thelen et al. |
| 6,254,686 B1 | 7/2001 | Comita et al. |
| 6,634,314 B2 | 10/2003 | Hwang et al. |
| 7,153,542 B2 | 12/2006 | Nguyen et al. |
| 8,372,202 B2 * | 2/2013 | Kato et al. .............. 118/719 |
| 8,465,592 B2 * | 6/2013 | Kato et al. .............. 118/719 |
| 2002/0066535 A1 | 6/2002 | Brown et al. |
| 2007/0095286 A1 * | 5/2007 | Baek et al. .............. 118/719 |
| 2007/0218701 A1 | 9/2007 | Shimizu et al. |
| 2007/0218702 A1 * | 9/2007 | Shimizu et al. ........... 438/758 |

FOREIGN PATENT DOCUMENTS

| | | |
|---|---|---|
| JP | 04-287912 | 10/1992 |
| JP | 3144664 | 3/2001 |
| JP | 2001-254181 | 9/2001 |
| JP | 2007-247066 | 9/2007 |

* cited by examiner

*Primary Examiner* — Karla Moore
*Assistant Examiner* — Nathan K Ford
(74) *Attorney, Agent, or Firm* — IPUSA, PLLC

(57) ABSTRACT

A film deposition apparatus includes: a turntable; a first reaction gas supply part and a second reaction gas supply part extending from a circumferential edge toward a rotation center of the turntable; and a first separation gas supply part provided between the first and second reaction gas supply parts. A first space contains the first reaction gas supply part and has a first height. A second space contains the second reaction gas supply part and has a second height. A third space contains a first separation gas supply part and has a height lower than the first and second heights. A motor provided under the rotation center of the turntable rotates the turntable. A rotation shaft of the turntable and a drive shaft of the motor are coupled without generation of slip.

18 Claims, 24 Drawing Sheets

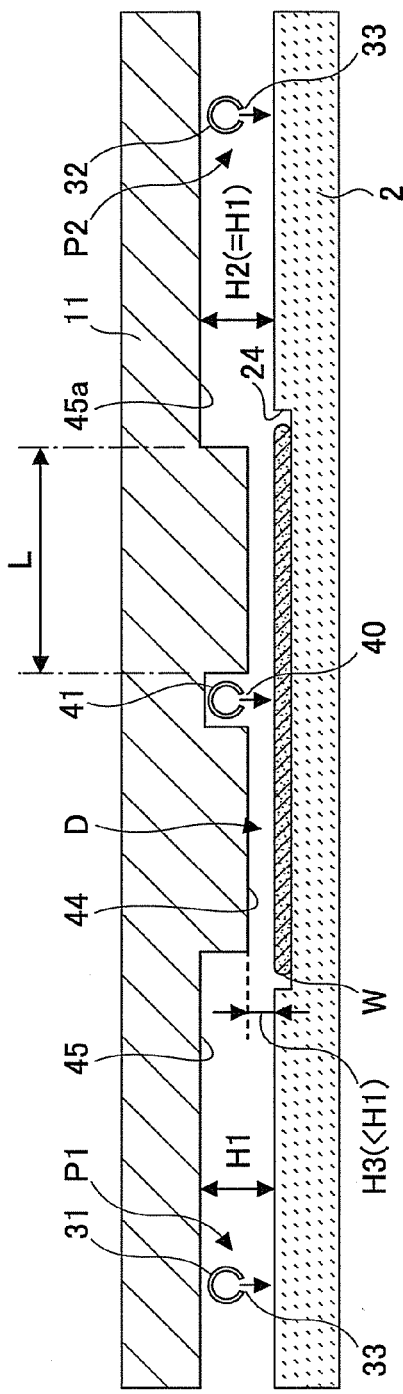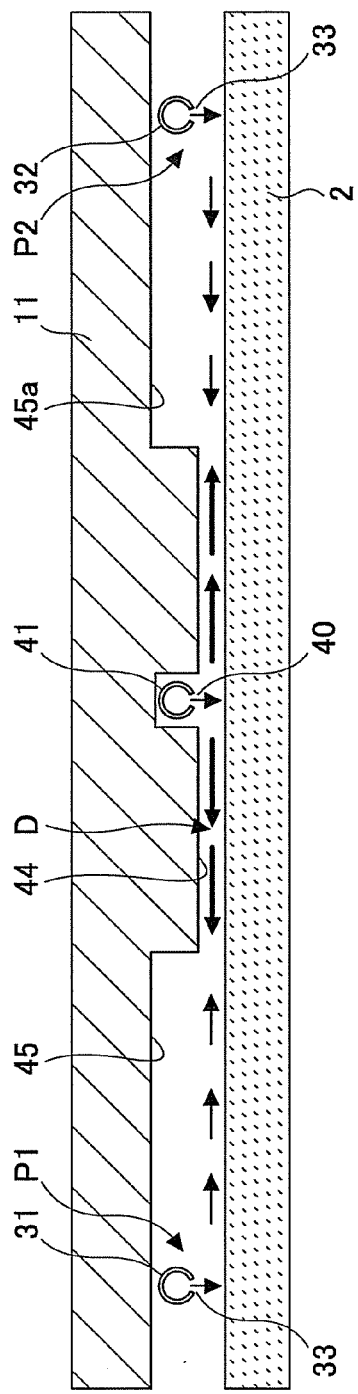

FILM DEPOSITION APPARATUS AND SUBSTRATE PROCESSING APPARATUS

CROSS-REFERENCE TO RELATED APPLICATIONS

This application is based upon and claims the benefit of priority of the prior Japanese Patent Application No. 2008-227028, filed on Sep. 4, 2009, the entire contents of which are incorporated herein by reference.

BACKGROUND OF THE INVENTION

1. Field of the Invention

The present invention relates to film deposition apparatuses and substrate processing apparatuses and, more particularly, to a film deposition apparatus and a substrate processing apparatus for depositing a thin film by alternately supplying at least two kinds of source gases.

2. Description of the Related Art

As a film deposition technique in a semiconductor fabrication process, there has been known a so-called Atomic Layer Deposition (ALD) or Molecular Layer Deposition (MLD). In such a film deposition technique, a first reaction gas is adsorbed on a surface of a semiconductor wafer (referred to as a wafer hereinafter) under vacuum and then a second reaction gas is adsorbed on the surface of the wafer in order to form one or more atomic or molecular layers through reaction of the first and the second reaction gases on the surface of the wafer; and such an alternating adsorption of the gases is repeated plural times, thereby depositing a film on the wafer. This technique is advantageous in that the film thickness can be controlled at higher accuracy by the number of times alternately supplying the gases, and in that the deposited film can have excellent uniformity over the wafer. Therefore, this deposition method is thought to be promising as a film deposition technique that can address further miniaturization of semiconductor devices.

Such a film deposition method may be preferably used, for example, for depositing a dielectric material to be used as a gate insulator. When silicon dioxide ($SiO_2$) is deposited as the gate insulator, a bis (tertiary-butylamino) silane (BTBAS) gas or the like is used as a first reaction gas (source gas) and ozone gas or the like is used as a second gas (oxidation gas).

In order to carry out such a deposition method, use of a single-wafer deposition apparatus having a vacuum chamber and a shower head at a top center portion of the vacuum chamber has been under consideration. In such a deposition apparatus, the reaction gases are introduced into the chamber from the top center portion, and unreacted gases and by-products are evacuated from a bottom portion of the chamber. When such a deposition chamber is used, it takes a long time for a purge gas to purge the reaction gases, resulting in an extremely long process time because the number of cycles may reach several hundred. Therefore, a deposition method and apparatus that enable high throughput is desired.

Under these circumstances, film deposition apparatuses having a vacuum chamber and a turntable that holds plural wafers along a rotation direction have been proposed.

Patent Document 1 listed below discloses a deposition apparatus whose process chamber is shaped into a flattened cylinder. The process chamber is divided into two half circle areas. Each area has an evacuation port provided to surround the area at the top portion of the corresponding area. In addition, the process chamber has a gas inlet port that introduces separation gas between the two areas along a diameter of the process chamber. With these configurations, while different reaction gases are supplied into the corresponding areas and evacuated from above by the corresponding evacuation ports, a turntable is rotated so that the wafers placed on the turntable can alternately pass through the two areas. A separation area to which the separation gas is supplied has a lower ceiling than the areas to which the reaction gases are supplied.

Patent Document 2 discloses a process chamber having a wafer support member (turntable) that holds plural wafers and that is horizontally rotatable, first and second gas ejection nozzles that are located at equal angular intervals along the rotation direction of the wafer support member and oppose the wafer support member, and purge nozzles that are located between the first and the second gas ejection nozzles. The gas ejection nozzles extend in a radial direction of the wafer support member. A top surface of the wafers is higher than a top surface of the wafer supporting member, and the distance between the ejection nozzles and the wafers on the wafer support member is about 0.1 mm or more. A vacuum evacuation apparatus is connected to a portion between the outer edge of the wafer support member and the inner wall of the process chamber. According to a process chamber so configured, the purge gas nozzles discharge purge gases to create a gas curtain, thereby preventing the first reaction gas and the second reaction gas from being mixed.

Patent Document 3 discloses a process chamber that is divided into plural process areas along the circumferential direction by plural partitions. Below the partitions, a circular rotatable susceptor on which plural wafers are placed is provided leaving a slight gap in relation to the partitions. In addition, at least one of the process areas serves as an evacuation chamber.

Patent Document 4 discloses a process chamber having four sector-shaped gas supplying plates each of which has a vortex angle of 45 degrees, the four gas supplying plates being located at angular intervals of 90 degrees, evacuation ports that evacuate the process chamber and are located between the adjacent two gas supplying plates, and a susceptor that holds plural wafers and is provided in order to oppose the gas supplying plate. The four gas supplying plates can discharge $AsH_3$ gas, $H_2$ gas, trimethyl gallium (TMG) gas, and $H_2$ gas, respectively.

Patent Document 5 discloses a process chamber having a circular plate that is divided into four quarters by partition walls and has four susceptors respectively provided in the four quarters, four injector pipes connected into a cross shape, and two evacuation ports located near the corresponding susceptors. In this process chamber, four wafers are mounted in the corresponding four susceptors, and the four injector pipes rotate around the center of the cross shape above the circular plate while ejecting a source gas, a purge gas, a reaction gas, and another purge gas, respectively.

Furthermore, Patent Document 6 (Patent Documents 7, 8) discloses a film deposition apparatus preferably used for an Atomic Layer CVD method that causes plural gases to be alternately adsorbed on a target (a wafer). In the apparatus, a susceptor that holds the wafer is rotated, while source gases and purge gases are supplied to the susceptor from above. Paragraphs 0023, 0024, and 0025 of the document describe partition walls that extend in a radial direction from a center of a chamber, and gas ejection holes that are formed in a bottom of the partition walls in order to supply the source gases or the purge gas to the susceptor, so that an inert gas as the purge gas ejected from the gas ejection holes produces a gas curtain. Regarding evacuation of the gases, paragraph 0058 of the document describes that the source gases are evacuated through an evacuation channel 30*a*, and the purge gases are evacuated through an evacuation channel 30*b*.

Patent Document 1: U.S. Pat. No. 7,153,542 (FIGS. 6A, 6B)

Patent Document 2: Japanese Patent Application Laid-Open Publication No. 2001-254181 (FIGS. 1, 2)

Patent Document 3: Japanese Patent Publication No. 3,144,664 (FIGS. 1, 2, claim 1)

Patent Document 4: Japanese Patent Application Laid-Open Publication No. H4-287912

Patent Document 5: U.S. Pat. No. 6,634,314

Patent Document 6: Japanese Patent Application Laid-Open Publication No. 2007-247066 (paragraphs 0023 through 0025, 0058, FIGS. 12 and 13)

Patent Document 7: United States Patent Publication No. 2007-218701

Patent Document 8: United States Patent Publication No. 2007-218702

However, in the apparatus disclosed in Patent Document 1, because the reaction gases and the separation gas are supplied downward and then evacuated upward from the evacuation ports provided at the upper portion of the chamber, particles in the chamber may be blown upward by the upward flow of the gases and fall on the wafers, leading to contamination of the wafers.

In the technique disclosed in Patent Document 2, the gas curtain cannot completely prevent mixture of the reaction gases but may allow one of the reaction gases to flow through the gas curtain to be mixed with the other reaction gas partly because the gases flow along the rotation direction due to the rotation of the wafer support member. In addition, the first (second) reaction gas discharged from the first (second) gas outlet nozzle may flow through the center portion of the wafer support member to meet the second (first) gas, because centrifugal force is not strongly applied to the gases in a vicinity of the center of the rotating wafer support member. Once the reaction gases are mixed in the chamber, an MLD (or ALD) mode film deposition cannot be carried out as expected.

In the apparatus disclosed in Patent Document 3, in a process chamber, process gas introduced into one of the process areas may diffuse into the adjacent process area through the gap below the partition, and be mixed with another process gas introduced into the adjacent process area. Moreover, the process gases may be mixed in the evacuation chamber, so that the wafer is exposed to the two process gases at the same time. Therefore, ALD (or MLD) mode deposition cannot be carried out in a proper manner by this process chamber.

The disclosure of Patent Document 4 does not provide any realistic measures to prevent two source gases ($AsH_3$, TMG) from being mixed. Because of the lack of such measures, the two source gases may be mixed around the center of the susceptor and through the $H_2$ gas supplying plates. Moreover, because the evacuation ports are located between the adjacent two gas supplying plates to evacuate the gases upward, particles are blown upward from the susceptor surface, which leads to wafer contamination.

In the process chamber disclosed in Patent Document 5, after one of the injector pipes passes over one of the quarters, this quarter cannot be purged by the purge gas in a short period of time. In addition, the reaction gas in one of the quarters can easily flow into an adjacent quarter. Therefore, it is difficult to perform an MLD (or ALD) mode film deposition.

According to the technique disclosed in Patent Document 6, source gases can flow into a purge gas compartment from source gas compartments located in both sides of the purge gas compartment and be mixed with each other in the purge gas compartment. As a result, a reaction product is generated in the purge gas compartment, which may cause particles to fall onto the wafer.

When performing a film deposition method in the film deposition apparatus disclosed in Patent Documents 1 through 5, because a rotation table or turntable has a large diameter to permit a plurality of wafers such as, for example, four to six sheets, placed thereon in a circular arrangement, an inertial force (hereinafter, referred to as inertia) of the turntable is large. Thus, if a method of driving the turntable by a stepping motor via a belt drive, which is a turntable driving method usually used in a film deposition apparatus in which a film deposition is carried out in a vacuum chamber, the turntable slips relative to the motor during acceleration and deceleration, which results in an angular displacement of an actual rotational angle with respect to a rotational angle instructed to the motor. Hereinafter, such an angular displacement in a rotational angle is referred to as a loss of synchronism. Although a motor for driving the turntable and a power transmission method are not disclosed in Patent Documents 1 through 5, in a method of driving a turntable by a stepping motor via a belt drive, which method is generally used in a film deposition apparatus using a vacuum chamber, because the inertia of the turntable is large, a slip (displacement) in rotational angles is generated between the turntable and a motor shaft due to a slip or a stretch of the belt at a time of start or at a time stop, which results in a loss of synchronism. As a result, when carrying a substrate into or out of a vacuum pump, there may occur a problem in that the substrate cannot be placed on the turntable with good positional accuracy or the substrate cannot be taken out of the turntable surely.

SUMMARY OF THE INVENTION

It is a general object of the present invention to provide a novel and useful film deposition apparatus and substrate processing apparatus, in which the above-mentioned problem is eliminated.

A more specific object of the present invention is to provide a film deposition apparatus and a substrate processing apparatus, which can provide a high throughput and perform a good process by preventing a plurality of reaction gases form being mixed with each other on a substrate when forming a thin film by laminating many layers of reaction product by sequentially supplying a plurality of reaction gases, which react with each other, onto a surface of the substrate.

It is another object of the present invention to provide a film deposition apparatus and a substrate processing apparatus, which are capable of surely performing a transfer of a substrate between an outside and an inside of a vacuum chamber.

In order to achieve the above-mentioned object, there is provided according to one aspect of the present invention a film deposition apparatus for depositing a thin film on a substrate in a vacuum chamber by sequentially supplying at least two kinds of source gases that contains a first reaction gas and a second reaction gas and by carrying out a supply cycle to sequentially supply the at least two kinds of source gases, the film deposition apparatus comprising: a turntable rotatably provided in the chamber and having a substrate placement part on which a substrate is placed; a first reaction gas supply part and a second reaction gas supply part each of which extends from one of positions different from each other on a circumferential edge of the turntable toward a rotation center of the turntable in order to supply the first reaction gas and the second reaction gas, respectively; a first separation gas supply part extending from a position on the circumferential edge of the turntable between the first reaction gas supply part and the second reaction gas supply part toward the rotation center of the turntable in order to supply a first separation gas for separating the first reaction gas and the second reaction gas from each other; a first bottom surface area defined in a bottom surface of a ceiling plate of the vacuum chamber and containing the first reaction gas supply part, the first bottom surface area provided at a first height from the turntable; a first space formed between the first bottom surface area and the turntable; a second bottom surface area defined in the bottom surface of the ceiling plate of the vacuum chamber and containing the second reaction gas supply part, the second bottom surface area provided at a position separate from the first bottom surface area and at a second height from the turntable; a second space formed between the second bottom surface area and the turntable; a third bottom surface area defined in the bottom surface of the ceiling plate and containing the first separation gas supply part, the third bottom surface area positioned on both sides of the first separation gas supply part along a rotating direction of the turntable, the third bottom surface area provided at a third height from the turntable lower than the first height and the second height; a thin third space formed between the third bottom surface area and the turntable and having the third height so that the first separation gas supplied from the first separation gas supply part flows into the first space and the second space; a central part area defined in the bottom surface of the ceiling plate, the central part area being provided with a second separation gas supply part on a side of the substrate placement part with respect to the rotation center of the turntable, the second supply part supplying a second separation gas for separating the first reaction gas and the second reaction gas from each other; an exhaust port configured to exhaust the first reaction gas and the second reaction gas together with the first separation gas discharged to both sides of the third space and the second separation gas discharged from the central part area; and a motor provided under a rotation shaft of the turntable to rotate the turntable, wherein the rotation shaft of the turntable is coupled to a drive shaft of the motor without slip.

There is provided according to another aspect of the present invention a substrate processing apparatus comprising: the above-mentioned film deposition apparatus; a vacuum conveyance chamber airtightly connected to the film deposition apparatus and provided with a substrate conveyance part therein; and a preliminary vacuum chamber airtightly connected to the vacuum transportation chamber, a pressure inside the preliminary vacuum chamber being changed between an atmospheric pressure and a vacuum pressure.

According to the present invention, a high throughput can be obtained, and a good process can be carried out by preventing a plurality of reaction gases from being mixed on the substrate. Additionally, because the turntable does not generate slip or a loss of synchronism with respect to the motor, a transfer of the substrate between an inside and an outside of the vacuum chamber can be performed surely.

Other objects, features and advantages of the present invention will become more apparent from the following detailed description when read in conjunction with the accompanying drawings.

BRIEF DESCRIPTION OF THE DRAWINGS

FIGS. 5A and 5B are cross-sectional views illustrating first through third spaces in the film deposition apparatus according to the first embodiment of the present invention;

DETAILED DESCRIPTION OF THE PREFERRED EMBODIMENTS

Figure 1:
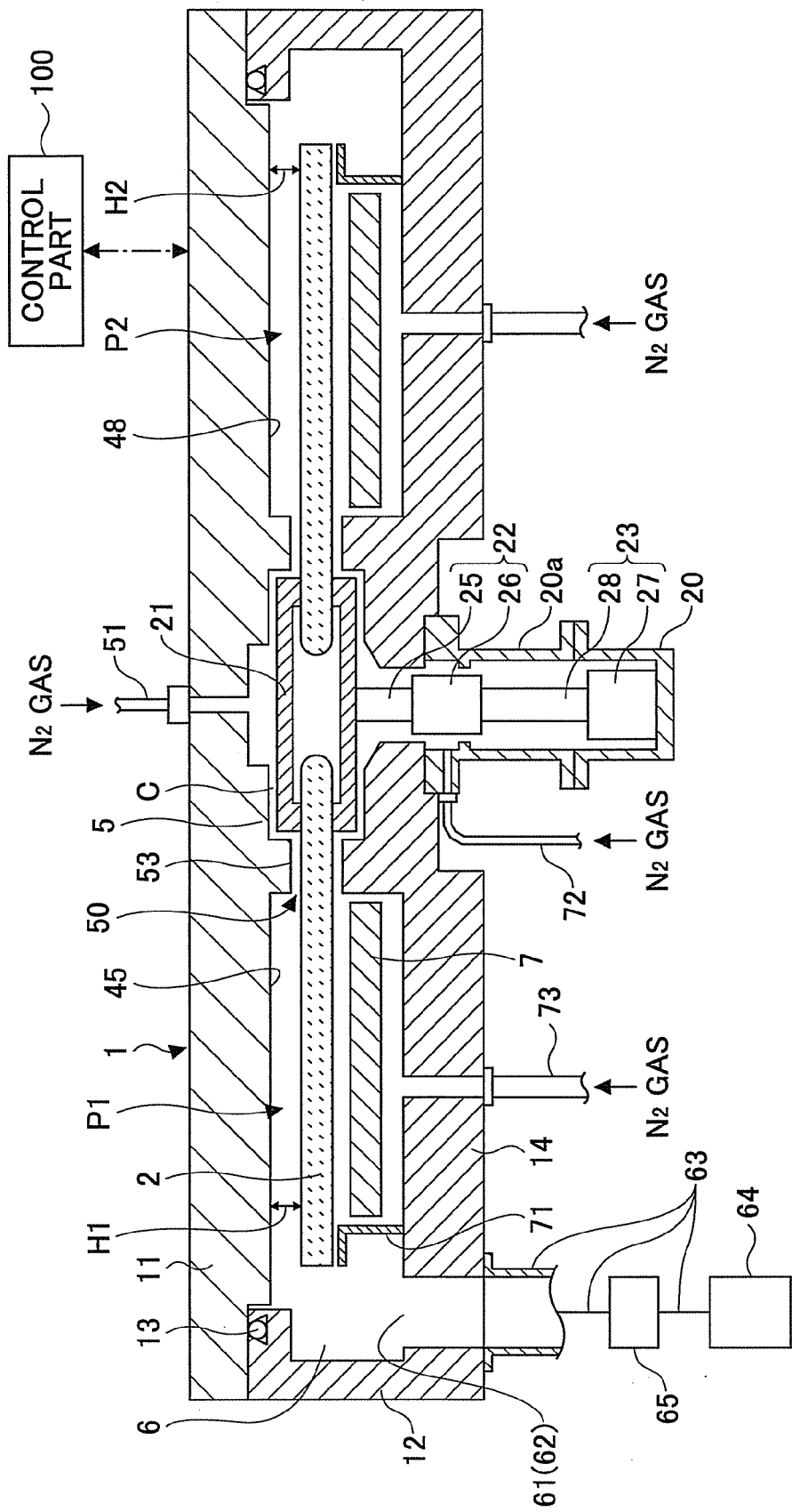
FIG. 1 is a vertical cross-sectional view illustrating a structure of a film deposition apparatus according to a first embodiment of the present invention.
Figure 2:
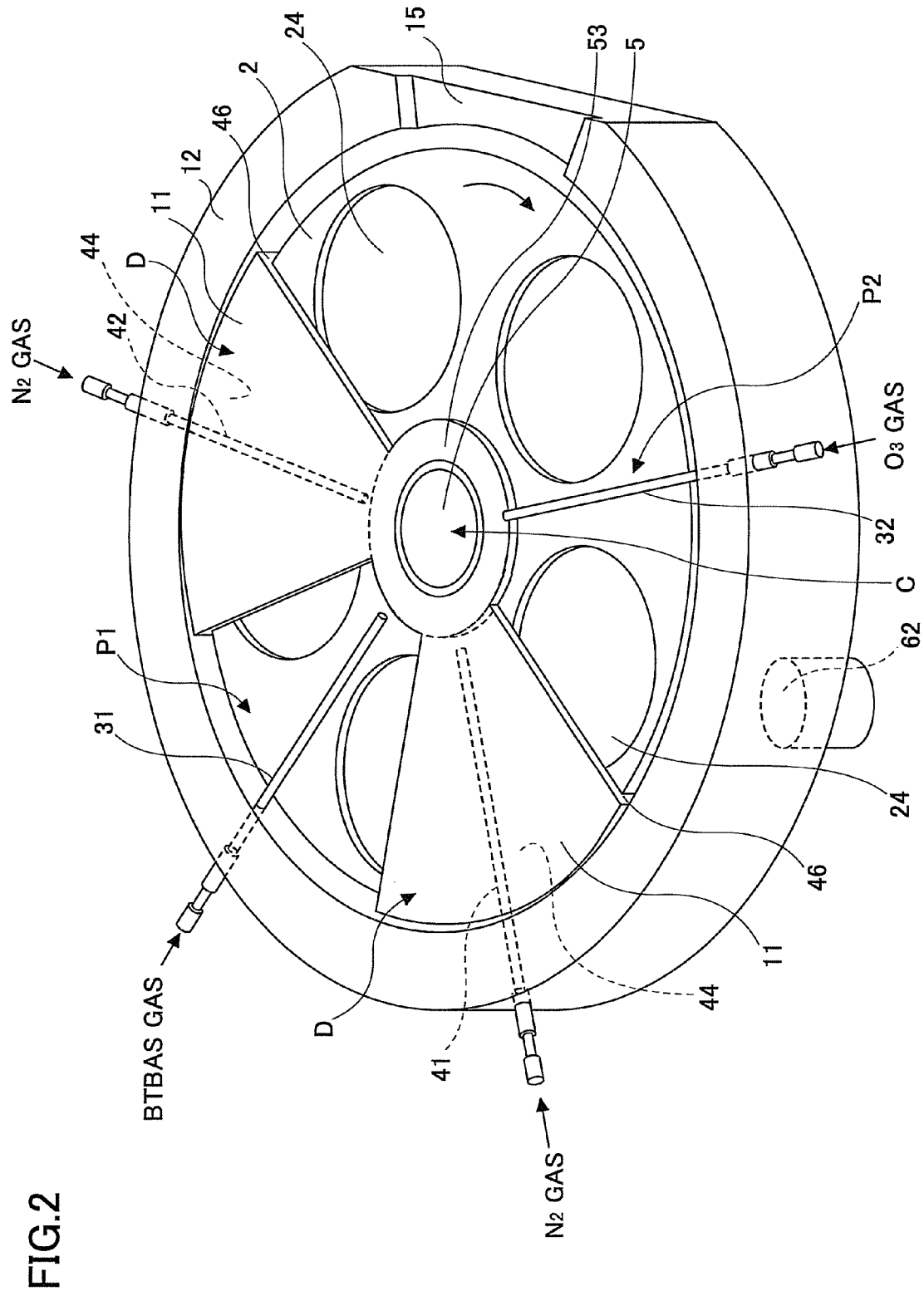
FIG. 2 is a perspective view illustrating the film deposition apparatus according to the first embodiment of the present invention.
Figure 3:
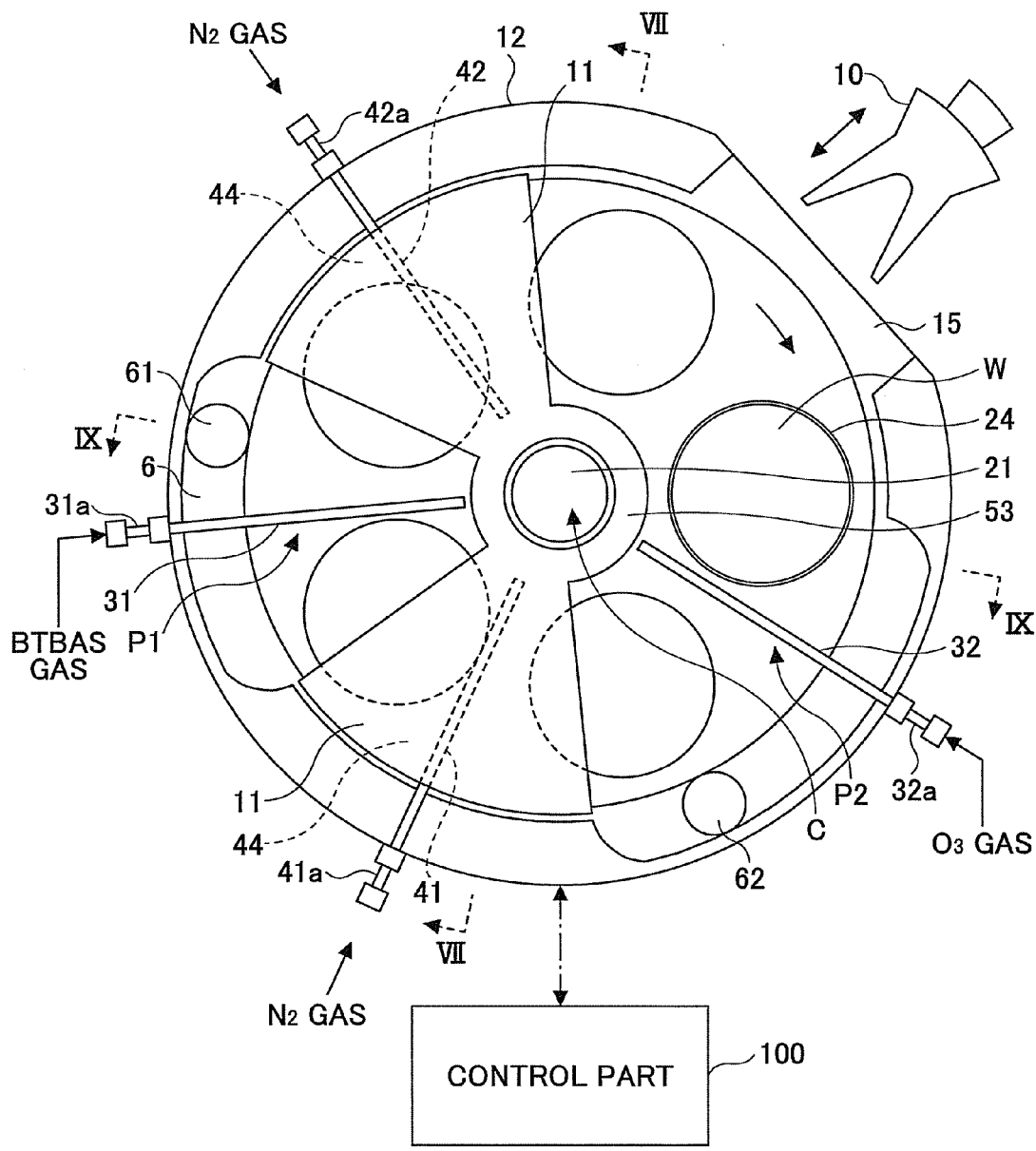
FIG. 3 is a horizontal cross-sectional view illustrating the film deposition apparatus according to the first embodiment of the present invention.

A description will now be given, with reference to FIG. 1 through FIG. 13, of a film deposition apparatus and a film deposition method according to a first embodiment of the present invention. First, a description is given, with reference to FIG. 1 through FIG. 12, of a structure of the film deposition apparatus according to the first embodiment of the present invention. As illustrated in FIG. 1 through FIG. 3, the film deposition apparatus according to the present embodiment includes a vacuum chamber 1, a turntable 2, a first reaction gas supply part 31, a second reaction gas supply part 32, and first separation gas supply parts 41 and 42. The vacuum chamber 1 has a ceiling plate 11a chamber body 12, an O-ring 13, and a bottom part 14. The ceiling plate 11 is detachably attached to the chamber body 12. The ceiling plate 11 is pressed against the chamber body 12 via the O-ring 13 due to depressurization inside the vacuum chamber in order to maintain an airtight state. When separating the ceiling plate 11 from the chamber body 12, the ceiling plate 11 is lifted upward by a drive mechanism, which is not illustrated in the figure.

A description will be given of the vacuum chamber 1 and the ceiling plate 11, the turntable 2 and a part under the ceiling plate 11 and above the turntable 2 from among parts accommodated in the vacuum chamber 1. That is, a description is given of the turntable 2, the first reaction gas supply part 31, the second reaction gas supply part 32, the first separation gas supply parts 41 and 42, the ceiling plate 11, and a second separation gas supply part 51.

As illustrated in FIG. 1, the turntable 2 is arranged so that a rotation center is coincident with the center of the vacuum chamber 1. The turntable 2 is equipped with a case member 20, a core part 21, a rotation part 22, a drive part 23, and a concave portion 24. The turntable 2 is fixed to the cylindrical core part 21 in the central part. The core part 21 is fixed to an upper end of the rotation part 22 extending in a vertical direction. The rotation part 22 penetrates the bottom part 14 of the vacuum chamber 1, and a lower end thereof is attached to the drive part 23, which rotates the rotation part 22 clockwise about a vertical axis. The rotation part 22 and the drive part 23 are accommodated in the cylindrical case member 20 having an opened top surface. A flange portion provided to a top surface of the case member 20 is airtightly attached to a bottom surface of the bottom part 14 of the vacuum chamber 1 so that the inside of the case member 20 is maintained in an airtight state. The rotation part 22 is equipped with a bearing part 25 and a coupling part 26 as illustrated in a FIG. 1 and FIG. 4. The bearing part 25 and the coupling part 26 are located under the rotation center of the turntable 2 in that order form a top.

Figure 4:
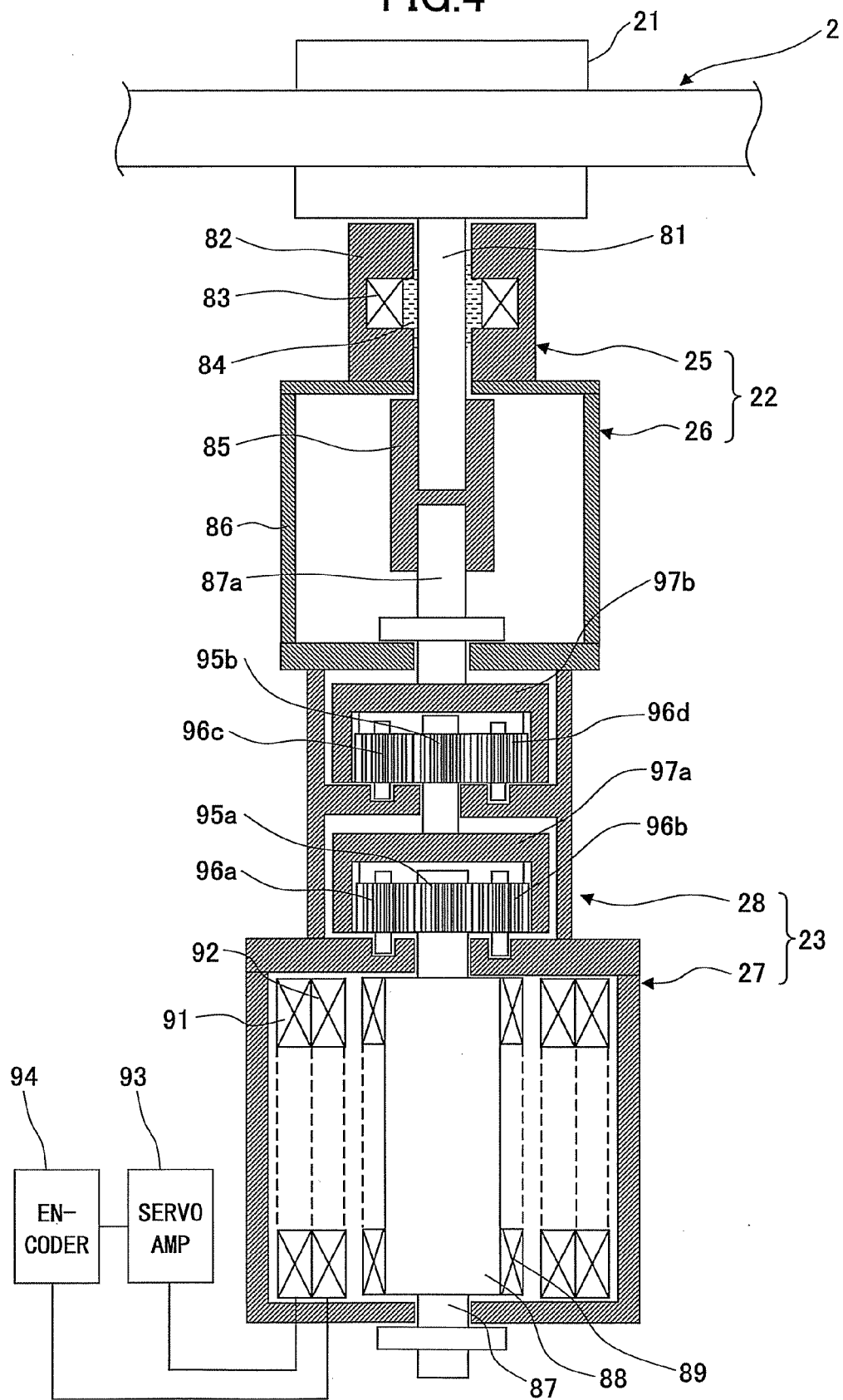
FIG. 4 is a cross-sectional view illustrating a structure of a turntable in the film deposition apparatus according to the first embodiment of the present invention.

The bearing part 25 is provided between the coupling part 26 and the turntable 2. The bearing part 25 is for supporting a rotational motion of a rotation shaft 81 of the rotation part 22. The bearing part 25 is not limited to a specific bearing if an abrasion powder is not generated because the baring part 25 is accommodate in the vacuum chamber 1, and, for example, a well-known magnetic fluid bearing may be used. In the present embodiment, as illustrated in FIG. 4, a magnetic fluid bearing is used. The bearing part 25 is provided with the rotation shaft 81, a bearing part case member 82, a permanent magnet 83, and a magnetic fluid 84. In the bearing part 25, the magnetic fluid 84 is attracted by the permanent magnet 83 and seals between the rotation shaft 81 and the bearing part case member 82 while maintaining a state where the rotation shaft 81 is freely rotatable. Thereby, the bearing part 25 can provide a bearing function without generation of an abrasion powder.

The coupling part 26 is provided between the bearing part 25 and a reduction apparatus 28 of the drive part 23 mentioned later. The coupling part 26 includes a joint 85 and a coupling part case member 86 in order to couple or join the rotation shaft 81 and a drive shaft 87a of the drive part 23 with each other without slip. The coupling structure between the rotation shaft 81 and the drive shaft 87a is not limited to a direct coupling if the rotation shaft 81 and the drive shaft 87a are coupled without slip, and the rotation shaft 81 and the drive shaft 87a may be coupled each other via a power transmission apparatus or a reduction apparatus. In the present embodiment, the rotation shaft 81 and the drive shaft 87a are coupled with each other via a reduction apparatus mentioned later.

The drive part 23 is equipped with a servo motor 27 and a reduction apparatus 28. In the drive part 23, the servo motor 27 is provided under the reduction apparatus 28. The servo motor 27 is for generating a rotational drive force, which rotates the turntable 2. The servo motor 27 is not limited to a specific motor, and a well-known DC servo motor, an AC servo motor, etc., may be used. In the present embodiment, as illustrated in FIG. 4, an AC servo motor is used. The servo motor 27 is equipped with a motor shaft (drive shaft) 87, a rotor (rotator) 8S, a motor magnet 89, motor windings 91, a sensor winding 92, a servo amplifier 93, and an encoder 94.

A description will be given below of a method of generating a rotational drive force by the servo motor 27. When a voltage is applied to the motor windings 91 in accordance with an instruction pulse from the servo amplifier 93, a current flows through the motor windings 91, which generates a magnetic field directed toward the rotation center of the rotor 88. Thereby, the motor windings 91 and the motor magnet 89 can be controlled in an attracting state or a repulsive state. Further, an alternating current is supplied to each of the motor windings 91 circumferentially arranged around the motor shaft 87 so that a predetermined phase difference is generated between the adjacent motor windings 91, thereby generating a rotating magnetic field in the circumferentially arranged motor windings 91. Because the motor magnet 89 rotates to follow the rotating magnetic field, the rotor 88 to which the motor magnet 89 is fixed is rotated, thereby generating a drive force in the motor shaft 87.

A description will be given of a method of controlling the rotation position of the rotor 88 in the servo motor 27. The rotation position (angular position) of the rotor 88 is detected by the sensor winding 92, and a detection signal of the sensor winding 92 is converted into an encoder pulse signal by the encoder 94 and is sent to the servo amplifier 93. The servo amplifier 93 compares the encoder pulse signal with an instruction pulse signal. If the encoder pulse signal is behind the instruction pulse signal, a voltage applied to the motor windings 91 is increased to increase a current flowing through the motor windings 91. On the other hand, if the encoder pulse signal is ahead of the instruction pulse signal, a voltage applied to the motor windings 91 is decreased to decrease a current flowing through the motor windings 91. Accordingly, a loss of synchronism of the servo motor 27 can be prevented by controlling the voltage supplied to the motor windings 91 so that the encoder pulse signal matches the instruction pulse signal supplied to the servo motor 27.

The reduction apparatus 28 is provided above the servomotor of the drive part 23. That is, the reduction apparatus 28 is arranged between servo motor 17 and the coupling part 26 of the rotation part 22. The reduction apparatus 28 is for slowing down the rotation speed of the servo motor 27 and transmitting a rotation driving force to the coupling part 26. The reduction apparatus 28 is not limited to a specific apparatus if the reduction apparatus is a power transmission type without slip, and, for example, a known reduction gear mechanism (gear box) may be used. Here, the expression "without slip" means that there is no slip generated between an input shaft and an output shaft of the reduction apparatus 28 and there is no play between the input shaft and the output shaft of the reduction apparatus 28. That is, the expression "without slip" means that a rotation of the output shaft is in complete response to a rotation of the input shaft, and there is no angular displacement between the input shaft and the output shaft. Accordingly, in the reduction apparatus without slip, for example, a rotation of the output shaft starts at the same time a rotation of the input shaft starts without a delay at a time of starting an operation of the reduction apparatus In the present embodiment, as illustrated in FIG. 4, the reduction apparatus 28 has a gear ratio of 1/9, in which two gear boxes each having a gear ratio of 1/3 are used. Specifically, the reduction apparatus 28 includes a first stage input gear (reduction apparatus input gear) 95a, first stage gears 96a and 96b, a first stage output gear 97a, a second stage input gear 95b, second stage gears 96c and 96d, and second stage output gear (reduction apparatus output gear) 97b. The gear ratio of the first stage input gear 95a and the first stage gears 96a and 96b is 1/1. The gear ratio of the first stage gears 96a and 96b and the first stage output gear 97a is 1/3. The gear ratio of the second stage input gear 95b and the second stage gears 96c and 96d is 1/1. The gear ratio of the second stage gears 96c and 96d and the second stage output gear 97b is 1/3. For example, by using the reduction apparatus 28 having the above-mentioned structure, the rotational speed of the servo motor 27 can be reduced to 1/9, and the rotational drive force (hereinafter, referred to as a rotational torque) of the servo motor 27 can be increased by 9 times.

In the present embodiment, the turntable 2 is formed of a carbon having a diameter of 960 mm and a thickness of 20 mm. Accordingly, the reduction apparatus 28 having a reduction ratio of 1/9 can be used together with the servo motor 27 of an input voltage of 200 V and a maximum power consumption of 500 W. Accordingly, the servo motor 27 can generate a sufficiently large rotational torque to the inertia of the turntable 2, and can rotationally drive the turntable 2 without slip and a loss of synchronism.

As illustrated in FIG. 2 and FIG. 3, in order to place a plurality of substrates, for example, 5 wafers, along a rotating direction (circumferential direction), concave portions 24 are provided on a surface of the turntable 24. Each concave portion 24 has a circular shape. The concave portions 24 are provided for positioning the wafers and preventing the wafers from moving due to a centrifugal force generated by a rotation of the turntable 2. The concave portions 24 correspond to a substrate placement part. It should be noted that FIG. 3 illustrates a state where a wafer W is accommodated in only one concave portion 24.

As illustrated in FIG. 5A, each concave portion 24 has a diameter slightly larger than a diameter of the wafer, for example, larger by 4 mm, and a depth of the concave portion 24 is set equal to a thickness of the wafer. Accordingly, when the wafer is placed in the concave portion 24, the surface of the wafer is the same height as the surface (an area where the wafer is not placed) of the turntable 2. If there is a large difference in heights (levels) between the wafer surface and the surface of the turntable 2, a pressure fluctuation may be generated at a step portion. Thus, in order to improve an inplane uniformity of a film thickness, it is necessary to equalize the heights (levels) of the wafer surface and the surface of the turntable 2. Equalizing the heights (levels) of the wafer surface and the surface of the turntable 2 means that the surface of the wafer (substrate) placed in the concave portion 24 (substrate placement part) is at the same height (level) as the surface of the turntable 2, or the surface of the wafer (substrate) placed in the concave portion 24 (substrate placement part) is lower than the surface of the turntable 2. However, it is desirable to set a difference in the height between both surfaces close to zero, and the difference in heights of both surfaces is preferably 5 mm or smaller. The bottom surface of the concave portion 24 is provided with three penetrating holes through which three lifting pins can extend, respectively, as mentioned later by referring to FIG. 10, the lifting pins for supporting a back surface of the wafer to move the wafer upward and downward.

The substrate placement part is not limited to a concave portion, and may be, for example, a structure in which a plurality of guide members arranged on the surface of the turntable 2 along a circumferential direction to guide the circumference of the wafer, or a structure in which a chucking mechanism such as an electrostatic chuck is provided on the turntable 2 side. If a wafer is attracted by a chuck mechanism, an area in which a wafer is placed by attraction corresponds to the substrate placement part.

The first reaction gas supply part 31, the second reaction gas supply part 32, and the two first separation gas supply parts 41 and 42 are provided at positions opposite to the concave portions 24 on the turntable 2 to extend from different positions along the circumference of the vacuum chamber 1 (circumference of the turntable 2) toward the center of rotation of the turntable 2, as illustrated in FIG. 2 and FIG. 3, in order to supply a first reaction gas and a second reaction gas. The first reaction gas supply part 31, the second reaction gas supply part 32, and the two first separation gas supply parts 41 and 42 include nozzles provided with discharge holes arranged with an interval in a longitudinal direction of each nozzle in order to discharge the reaction gases downward.

Figure 6:
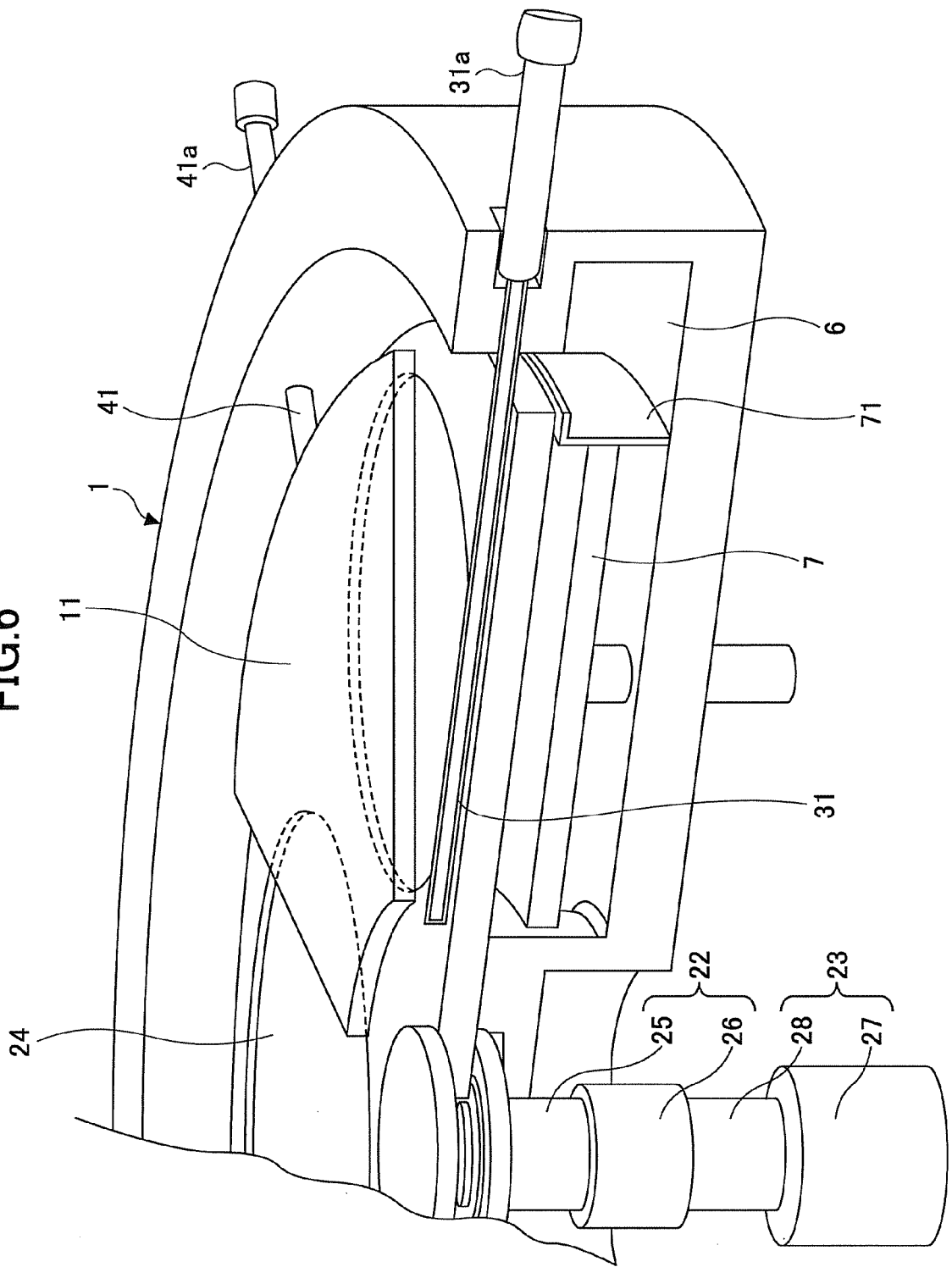
FIG. 6 is a perspective view of a first reaction gas supply part in the film deposition apparatus according to the first embodiment of the present invention.

The first reaction gas supply part 31, the second reaction gas supply part 32, and the first separation gas supply parts 41 and 42 are attached to, for example, a side wall of the vacuum chamber 1. Gas introduction ports 31a, 32a, 41a and 42a, which are base ends, penetrate the side wall of the vacuum chamber 1. Although the gas introduction ports 31a, 32a, 41a and 42a are introduced from the side wall of the vacuum chamber 1 in the present embodiment as illustrated in FIG. 6, the gas introduction ports 31a, 32a, 41a and 42a may be introduced from an annular projection part 53 mentioned later. In such a case, L-shaped introduction pipes, which open at a circumferential surface of the projection part 53 and an outer surface of the ceiling plate 11 so that the first reaction gas supply part 31, the second reaction gas supply part 32, and the first separation gas supply parts 41 and 42 are connected to the openings at ends of the L-shaped introduction pipes in the vacuum chamber 1 and the gas introduction ports 31a, 32a, 41a and 42a are connected to the openings at the other ends of the L-shaped introduction pipes outside the vacuum chamber 1.

Discharge holes 33 are provided in each of the first reaction gas supply part 31 and a second reaction gas supply part 32, at an interval in a longitudinal direction of the nozzle, as illustrated in FIG. 5A and FIG. 5B, to discharge reaction gases downward. In the present embodiment, for example, the discharge holes 33 have an opening diameter of 0.5 mm and are arranged at an interval of 10 mm along a longitudinal direction of each of the gas nozzles forming the first reaction gas supply part 31 and the second reaction gas supply part 32.

Discharge holes 40 are provided in each of the first separation gas supply parts 41 and 42 at an interval in a longitudinal direction, as illustrated in FIG. 5A and FIG. 5B, to discharge a separation gas downward. In the present embodiment, for example, the discharge holes 40 have an opening diameter of 0.5 mm and are arranged at an interval of 10 mm along a longitudinal direction of each of the gas nozzles forming the first separation gas supply part 41 and 42.

The first reaction gas supply part 31 and the second reaction gas supply part 32 are connected to a gas supply source of the first reaction gas and a gas supply source of the second reaction gas arranged outside the vacuum chamber 1. The first separation gas supply parts 41 and 42 are connected to a gas supply source of the first separation gas arranged outside the vacuum chamber 1. In the present embodiment, the second reaction gas supply part 32, the first separation gas supply part 41, the first reaction gas supply part 31, and the first separation gas supply part 42 are arranged in that order in a clockwise direction.

In the present embodiment, as the first reaction gas, for example, BTBAS (bis (tertiary-butylamino) silane) gas can be used, and, for example, $O_3$ (ozone) gas can be used as the second reaction gas. Furthermore, for example, $N_2$ (nitrogen) gas can be used as the first separation gas. Although the first separation gas is not limited to $N_2$ (nitrogen) gas and an inert gas such as Ar (argon) gas may be used, the first separation gas is not limited to an inert gas and a hydrogen gas may be used. That is, the first separation gas is not limited to a specific kind of gas and any gas may be used if the gas does not influence a film deposition process.

A bottom surface of the ceiling plate 11 includes three areas, that are, a first bottom surface part 45 (first bottom surface area), a second bottom surface part 45a (second bottom surface area) and a third bottom surface part 44 (third bottom surface area), as illustrated in FIG. 2, FIG. 3, FIG. 5A and FIG. 5B. The first bottom surface 45 is separated from the upper surface of the turntable 2 by a distance H1. The second bottom surface part 45a is separated from the upper surface of the turntable 2 by a distance H2. The third bottom surface part 44 is separated from the upper surface of the turntable 2 by a distance H3. The bottom surface of the ceiling plate 11 also includes a projection part 53 and rotation center side part 5 in the first bottom surface part 45 and the second bottom surface part 45a. The projection part 53 is adjacent to the rotation center of each area, and the rotation center side part 5 corresponds to the core part 21.

The first bottom surface part 45, the second bottom surface part 45a, and the third bottom surface part 44 are areas of the bottom surface of the ceiling plate 11, which areas include the first reaction gas supply part 31, the second reaction gas supply part 32, and the first separation gas supply part 41, respectively. The third bottom surface part 44 is bisected by the first separation gas supply part 41. As illustrated in FIG. 2, FIG. 3, FIG. 5A and FIG. 5B, a first space P1, a second space P2, and two third spaces D are formed between the turntable 2 and the ceiling plate in each of the four areas of the bottom surface of the ceiling plate 11, that are, the first bottom surface part 45, the second bottom surface part 45a, and the two third bottom surface parts 44.

The first bottom surface part 45 of the ceiling plate 11 is an area of the bottom surface of the ceiling plate 11 including the first reaction gas supply part 31, as illustrated in FIG. 5A and FIG. 5B. The second bottom surface part 45a of the ceiling plate 11 is an area of the bottom surface of the ceiling plate 11 including the second reaction gas supply part 32, as illustrated in FIG. 5A and FIG. 5B. The third bottom surface parts 44 of the ceiling plate 11 are areas of the bottom surface of the ceiling plate 11 including the first separation gas supply parts 41 and 42, respectively, as illustrated in FIG. 2, FIG. 5A and FIG. 5B. Distances from the center of each of the first separation gas supply parts 41 and 42 to edges of the third bottom surface parts 44 having a sectoral shape in a normal rotating direction and a reverse rotating direction of the turntable 2 are set equal to each other.

A width of each of the third bottom surface parts 44 of the ceiling plate 11 can be increased toward the circumferential edge of the turntable 2 on an upstream side of the respective first separation gas supply parts 41 and 42 in a rotating direction of the turntable 2. This is because, a speed of a gas flow from an upstream side in the rotating direction to the first bottom surface parts 44 is higher as it goes close to the circumferential edge of the turntable 2. In the present embodiment, a wafer W having a diameter of 300 mm is used as a substrate to be processed. Accordingly, a length of each of the third bottom surface parts 44 in a circumferential direction (a length of an arc of a circle concentric to the turntable 2) is, for example, 146 mm at a portion separated from the rotation center by 140 mm and close to the projection part 53, and, for example, 502 mm at an outermost portion of the concave portion 24 (substrate placement part). As illustrated in FIG. 5A, at the outermost portion, a length L is 246 mm, where the length L is measured from an end of the first separation gas supply part 41(42) to a circumference of the third bottom surface part 44.

The first bottom surface part 45 of the ceiling plate 11 including the first reaction gas supply part 31 is positioned at a height H1 from the turntable 2, as illustrated in FIG. 1 and FIG. 5A. The second bottom surface part 45a of the ceiling plate 11 including the second reaction gas supply part 32 is positioned at a height H2 from the turntable 2, as illustrated in FIG. 1 and FIG. 5A. The third bottom surface parts 44 of the ceiling plate 11 including the first reaction gas supply parts 41 are positioned at a height H3 from the turntable 2, as illustrated in FIG. 5A. The third height H3 is lower than the first height H1 and the second height H2. A relationship between the first height H1 and the second height H2 is not limited to a specific relationship, and, for example, the first height H1 can be equal to the second height H2 (H1=H2). Accordingly, in the present embodiment those heights are set to satisfy a relationship H3<H1=H2.

As illustrated in FIG. 5A, the third bottom surface parts 44, which are portions of the bottom surface of the ceiling plate 11 provided at the height H3 from the turntable 2, exist on both sides in the rotating direction in the first separation gas supply part 41, and the first bottom surface part 45 and the second bottom surface part 45a, which are higher than the third bottom surface parts 44, exist on both sides in the rotating direction. In other words, the third space D exists on both sides in the rotating direction in the first separation gas supply part 41, and first space P1 and the second space P2 exist on both sides of the space D3 in the rotating direction. Similarly, the third space D exists between the opposite side of the first space P1 and the opposite side of the second space P2.

Figure 7:
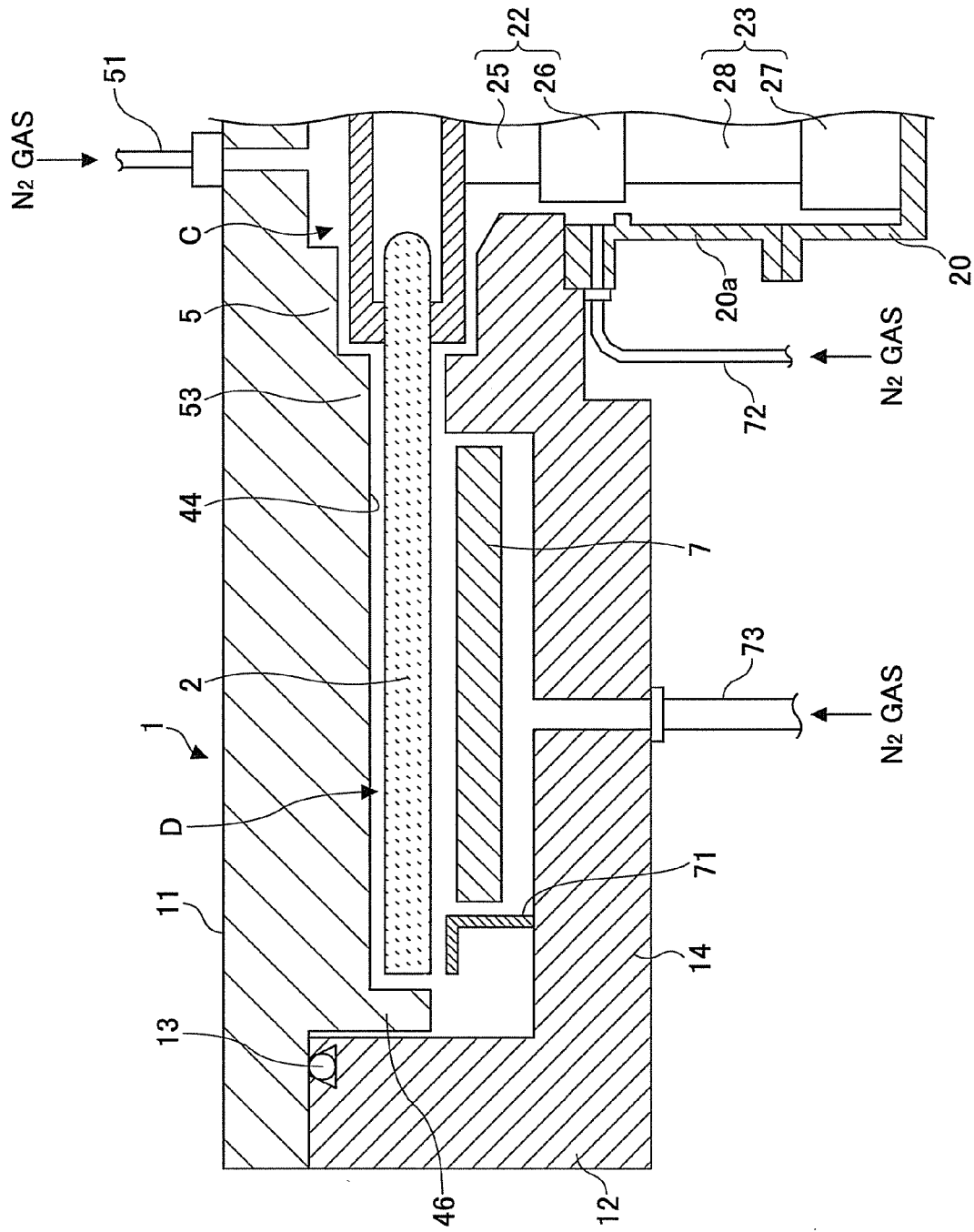
FIG. 7 is a cross-sectional view of the film deposition apparatus take along a line VII-VII in FIG. 3.

As illustrated in FIG. 7, the circumferential edge of the ceiling plate 11 (a portion of an outer edge of the vacuum chamber 1) facing the third space D forms a bent part 46 by being bent in an L-shape along the outer edge surface of the turntable 2. Because the ceiling plate 11 is removable from the chamber body 12, there is a small gap between the outer surface of the bent part 46 and the chamber body 12. The bent part 46 is provided, similar to the third bottom surface parts 44, to prevent the first and second reaction gases from being mixed with each other. The gap between the inner surface of the bent part 46 and the outer edge surface of the turntable 2 and the gap between the outer surface of the bent part 46 and the chamber body 12 are set to a dimension equal to the height H3 of the third bottom surface parts 22 from the surface of the turntable 2. That is, in the surface side area of the turntable 2, the inner surface of the bent part 46 provides the same function as the inner wall of the vacuum chamber 1.

FIG. 3 and FIG. 5 are cross-sectional views of the ceiling plate 11 of the vacuum chamber 1 taken along a plane lower than the first bottom surface part 45 and the second bottom surface part 45a and higher than the first separation gas supply parts 41 and 42.

A description will now be given of a separating action of the atmosphere of the first space P1 and the atmosphere of the second space P2. The third bottom surface part 44 in combination with the first separation gas supply part 41 prevents the first and second reaction gases from entering the third space D and being mixed with each other in the third space D. That is, in the third space D, the second reaction gas is prevented from entering the third space D in a reverse rotating direction of the turntable 2, and also the first reaction gas is prevented from entering the third space D in a normal rotating direction of the turntable 2. The expression "prevented from entering" means that the first separation gas discharged from the first separation gas supply part 41 diffuses in the third space D and flows to the second space P2, which is a space under the adjacent second bottom surface part 45a, and, thereby, the gases cannot enter from the adjacent first space P1 and the adjacent second space P2. The expression "gases cannot enter" does not mean only a state where completely no gas is allowed to enter the third space D from the adjacent first and second spaces P1 and P2, but it means that a small amount of gases may enter the third space D but the first reaction gas and the second reaction gas entering the third space D from opposite sides are not mixed with each other in the third space D. As long as this state is achieved, the separating action of the atmosphere of the first space P1 and the atmosphere of the second space P2, which action is a role of the third space D, is ensured. Because gases adhered onto the wafer can pass through the third space D, the gases in the expression "gases entering" means a gaseous phase of gases.

As illustrated in FIG. 5A, the height H3 of the third bottom surface parts 44 from the turntable 2 may be, for example, about 0.5 mm to about 10 mm, and preferably about 4 mm. In this case, the rotational speed of the turntable 2 is set to, for example, 1 rpm to 500 rpm. In order to ensure the separating function of the third bottom surface parts 44, a size and the height H3 from the turntable 2 of the third bottom surface parts 44 are set previously according to experiments in accordance with a range of the rotational speed of the turntable 2 being adopted. Although an inert gas such as Ar gas other than $N_2$ gas can be used as the first separation gas, the first separation gas is not limited to an inert gas, and there is no limitation to a kind of gas if it is a gas which does not influence the film deposition process.

Figure 8A:
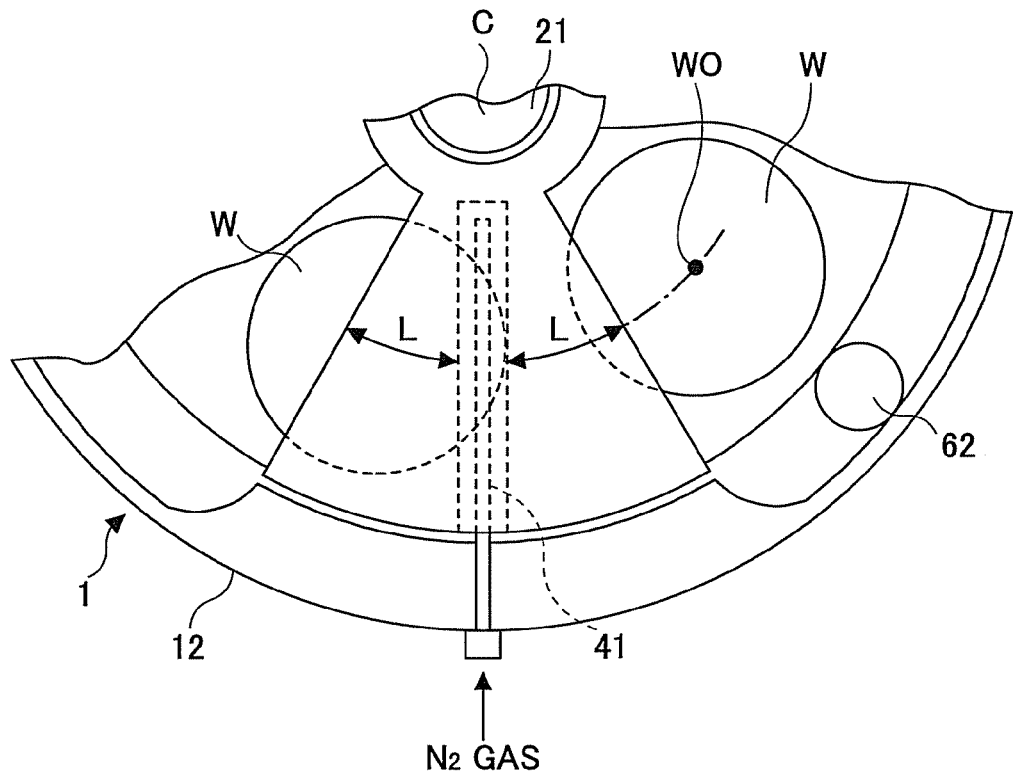
FIG. 8A is a plan view for explaining the film deposition apparatus according to the first embodiment of the present invention.
Figure 8B:
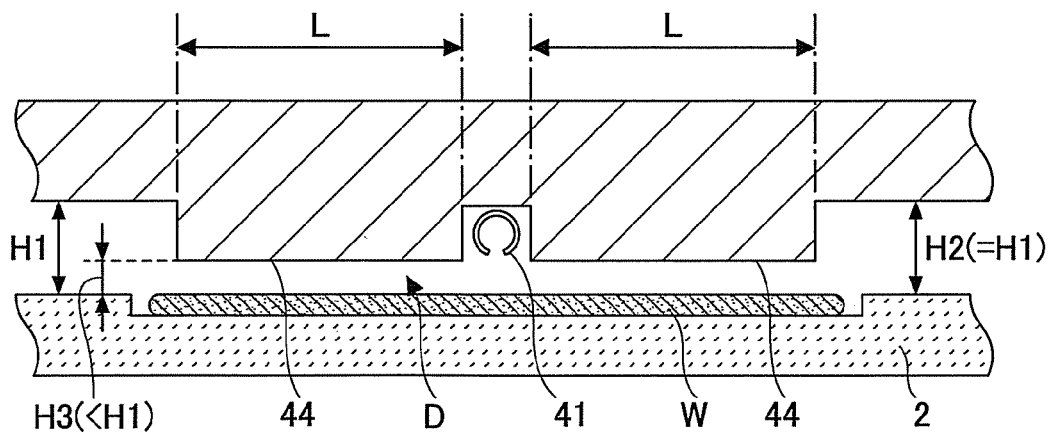
FIG. 8B is a cross-sectional view for explaining the film deposition apparatus according to the first embodiment of the present invention.

The third bottom surface parts 44 forming thin or narrow spaces positioned opposite sides of the first separation gas supply part 41 (42) preferably have a width L equal to or larger than 50 mm, the width L being a width of a portion, where a center WO of the wafer W passes through, measured along the rotating direction of the turntable 2 in a case where the wafer W having a diameter of 300 mm is used as the substrate to be processed, as illustrated in the first separation gas supply part 41 as a representative in FIG. 8A and FIG. 8B.

In order to effectively prevent the reaction gas from entering the third space D from opposite sides of the third bottom surface part 44, the third space D being a thin or narrow space having the height H3 lower than the first height H1 and the second height H2, if the width L is small, it is necessary to reduce the third height H3, which is a distance between the third bottom surface part 44 and the turntable 2 in response to the width L. Further, if the height H3, which is a distance between the third bottom surface part 44 and the turntable 2, is set to a certain distance, the width L required for obtaining an entrance preventing effect of reaction gases is increased as it goes away from the rotation center of the turntable 2 because a speed at a portion of the turntable 2 increases as it goes away from the rotation center of the turntable 2. Considering this viewpoint, if the width L at a portion where the center WO of the wafer W passes is smaller than 50 mm, the height H3, which is a distance between the third bottom surface part 44 and the turntable 2, must be greatly reduced, and, thus, it is required to suppress a swing or deflection of the turntable 2 in a direction perpendicular to the surface of the turntable 2 as much as possible to prevent the third bottom surface part 44 from colliding with the turntable 2 or the wafer W when the turntable 2 is rotated. Furthermore, because the reaction gases tend to enter the space under the third bottom surface part 44 from an upstream side of the third bottom surface part 44 as the rotational speed of the turntable increases, the rotational speed of the turntable 2 must be reduced if the width L is set smaller than 50 mm, which is inadvisable with respect to a throughput. Accordingly, it is desirable to set the width L equal to or greater than 50 mm. However, the size of the third bottom surface part 44 is not limited to the above-mentioned size, and may be adjusted according to process parameters and wafer sizes used. Additionally, as apparent from the above explanation, as long as the third space D, which is a thin or narrow space, has a height at which a flow of the separation gas from the third space D to the first (second) space P1 (P2) is permitted, the height H3 (third height) of the thin or narrow space (third space D) can also be adjusted according the process parameters and wafer sizes used.

As illustrated in FIG. 1, the projection part 53 of the ceiling plate 11 is an area facing the turntable 2 and positioned between the rotation center side and the circumferential side of the core part 21 in the first bottom surface part 45 and the second bottom surface part 45a. The projection part 53 of the ceiling plate 11 is continuous and integrally formed with the rotation center side of each area, as illustrated in FIG. 7, and the bottom surface thereof has the same height as the third bottom surface part 44. However, the projection part 53 of the ceiling plate 11 and the third bottom surface parts 44 are not always integrally formed, and may be separate parts.

The rotation center side part 5 of the ceiling plate 11 is an area located in the rotation center side of the projection part 53. In the present embodiment, a boundary between the rotation center side part 5 and the projection part 53 can be provided on a circumference having a radius of 140 mm, for example, from the rotation center.

As illustrated in FIG. 1 and FIG. 7, the second separation gas supply part 51 penetrates the ceiling plate 11 of the vacuum chamber 1 and is connected to the central part of the vacuum chamber 1. The second separation gas supply part 51 is for supplying the second separation gas to the central part area C (may be referred to as a center area), which is a space between the ceiling plate 11 and the core part 21. Although there is especially nothing that is limited as second separation gas, N2 gas is used, for example.

The second separation gas supplied to the central part area C flows through the narrow gap 50 between the projection part 53 and the turntable 2 and is discharged toward the circumference edge along the surface of the substrate placement part side of the turntable 2. Because the space surrounded by the projection part 53 is filled by the second separation gas, the first reaction gas and the second reaction gas are prevented from being mixed with each other through the central portion of the turntable 2 between the first space P1 and the second space P2. That is, the film deposition apparatus is provided with the central part area C defined by the central portion of the turntable 2 and the vacuum chamber 1 to separate the atmosphere of the first space P1 and the atmosphere of the second space P2, the second separation gas being supplied to the central part area C and a discharge port for discharging the separation gas to the surface of the turntable 2 being formed along the rotating direction in the central part area C. The discharge port corresponds to the narrow gap 50 between the projection part 53 and the turntable 2.

A description will now be given of parts, which are located on the circumferential surface side of the turntable 2 and under the turntable 2 and above the bottom part 14. That is, a description is given of the chamber body 12 and an exhaust space 6.

In the third space D, as illustrated in FIG. 7, the inner wall of the chamber body 12 is formed as a vertical surface adjacent to the outer surface of the bent part 46. On the other hand, in a portion other than the third space D, as illustrated in FIG. 1, the chamber body 12 has a structure in which a vertical cross sectional shape is cut out in a square shape and recessed outward from a portion facing the outer edge surface of the turntable 2 to the bottom part 14. The recessed portion corresponds to the exhaust space 6. A bottom part of the exhaust space 6 is provided with, for example, two exhaust ports 61 and 62 as illustrated in FIG. 1 and FIG. 3. The exhaust ports 61 and 62 are connected to a common vacuum pump 64, which is an example of a vacuum exhaust means, through exhaust pipe 63. A pressure adjuster 65 as pressure adjusting means is provided to the exhaust pipe 63. The pressure adjuster 65 may be provided to each of the exhaust ports 61 and 62, or may be commonly used. The exhaust ports 61 and 62 are provided on both sides of the third space D in the rotating direction in a plan view in order to exclusively exhaust the first reaction gas and the second reaction gas. In the present embodiment, the exhaust port 61 is provided between the first reaction gas supply part 31 and the third space D, which is adjacent to the first reaction gas supply part 31 on the downstream side in the rotating direction. On the other hand, the second exhaust port 62 is provided between the second reaction gas supply part 32 and the third space adjacent to the second reaction gas supply part 32 on the downstream side in the rotating direction.

The number of the exhaust ports is not limited to two, and three exhaust ports may be provided by adding an additional exhaust port between the third space D containing the first separation gas supply part 42 and the second reaction gas supply part 32 adjacent to the third space D on the downstream side in the rotating direction, or four or more exhaust ports may be provided. The exhaust ports 61 and 62 are provided at positions lower than the turntable 2 in the bottom part 14 of the vacuum chamber 1 in the present embodiment in order to exhaust the gases through the gap between the inner wall of the vacuum chamber 1 and the circumferential edge of the turntable 2. However the exhaust ports 61 and 62 are not limited to be provided in the bottom part 14 of the vacuum chamber 1, and may be provided on the side wall of the vacuum chamber 1. If the exhaust ports 61 and 62 are provided on the side wall of the vacuum chamber 1, the exhaust ports 61 and 62 may be provided at positions higher than the turntable 2. Because the gases on the turntable 2 flow toward outside the turntable 2 by providing the exhaust ports 61 and 62 as mentioned above, there is an advantage in that scattering of particles is suppressed as compared to a case where the exhaust is performed through a ceiling surface facing the turntable 2.

A description will be given below of a part under the turntable 2 and to the bottom part 14 of the vacuum chamber 1, from among parts accommodated in the vacuum chamber 1. Specifically, a description is given of a heater unit 7 (heating part), a cover member 71, the bottom part 14, a third separation gas supply part 72 and the fourth separation gas supply part 74.

As illustrated in FIG. 1 and FIG. 6, the heater unit 7 is provided between the turntable 2 and the bottom part 14 of the vacuum chamber 1. The heater unit 7 is for heating a wafer on the turntable 2 at a temperature determined by a process recipe via the turntable 2. Instead of providing the heater unit 7 under the turntable 2, the heater unit 7 may be provided above the turntable 2, or may be provided on both above and under the turntable 2. Moreover, the heater unit 7 is not limited to one using a resistance heating element, and one using an infrared lamp may be used. A lower half portion of the heater unit 7 may be provided with a reflector (reflection plate), which reflects a heat radiation traveling in a downward direction, from among heat radiation generated by the heater unit 7, to an upward direction.

The temperature of the turntable 2 heated by the heater unit 7 is measured by a thermocouple embedded in the bottom part 14 of the vacuum chamber 1. A value of the temperature measured by the thermocouple is sent to the control part 100. The control part 100 controls the heater unit 7 to maintain the temperature of the turntable 2 at a predetermined temperature.

The cover member 71 is provided on the circumferential edge side of the turntable 2 and under the turntable 2 to section a space under the turntable and the exhaust space 6. The cover member 71 is formed to surround the entire heater unit 71. The cover member 71 is formed in a flange shape with an upper edge being bent outward to reduce a gap between a bent surface and the bottom surface of the turntable 2, thereby preventing the first reaction gas and the second reaction gas entering in an inner circumference side of the cover member 71 and being mixed with each other.

The bottom part 14 is adjacent to the central part of the bottom surface of the turntable 2 and the core part 21 with a narrow gap in a portion closer to the rotation center than the space where the heater unit 7 is arranged. In a penetration hole penetrating the bottom part 14 to accommodate the rotation shaft 22, a gap between the inner surface of the penetration hole and the rotation shaft 22 is narrow. The penetration hole is connected to the case member 12.

The third separation gas supply part 72 is provided to the case member 20. The third separation gas supply part 72 is provided to supply a third separation gas to a thin or narrow space. The third separation gas is not limited to a specific gas, and, for example, $N_2$ gas is used.

The fourth separation gas supply part 73 is provided at a plurality of positions along the rotating direction under the heater unit 7 in the bottom part 14 of the vacuum chamber 1. The fourth separation gas supply part 73 is used for supplying a fourth separation gas to the space where the heater unit 7 is arranged. The fourth separation gas is not limited to a specific gas, and, for example, $N_2$ gas is used.

Figure 9:
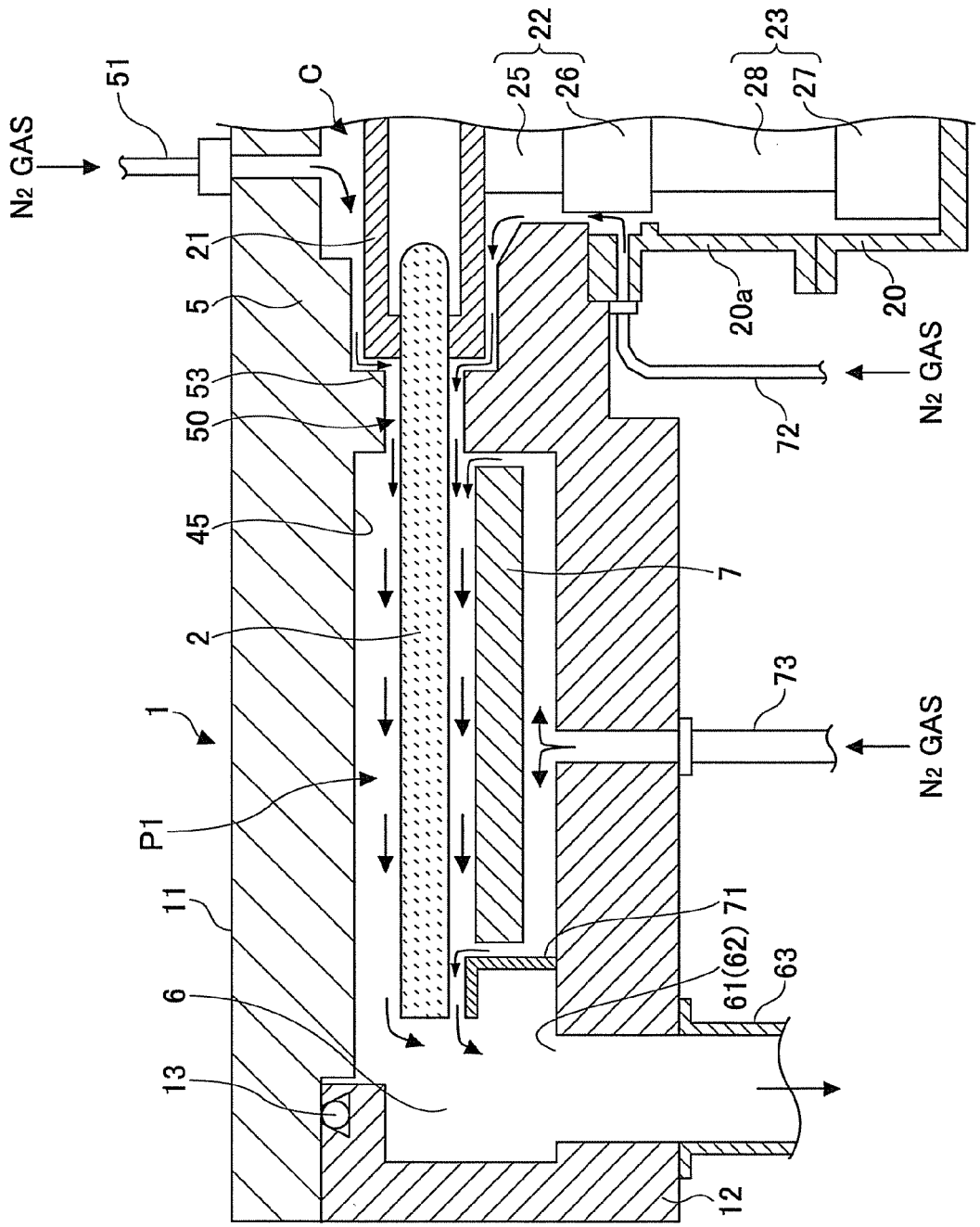
FIG. 9 is a cross-sectional view of the film deposition apparatus taken along a line IX-IX in FIG. 3.

In FIG. 9, flow paths of the third separation gas and the fourth separation gas are indicated by arrows. For example, $N_2$ gas is supplied to a space extending from inside the case member 12 to the space where the heater unit 7 is arranged by providing the third separation gas supply part 72 and the fourth separation gas supply part 73 so that the $N_2$ gas is exhausted to the exhaust ports 61 and 62 through the exhaust space 6 from the gap between turntable 2 and the cover member 71. Thereby, the first reaction gas and the second reaction gas are prevented from flowing from one of the first space P1 and the second space P2 to the other of the first space P1 and the second space P2 by flowing under the turntable 2, and, thus, the third separation gas has a function as a separation gas. Additionally, because the first reaction gas and the second reaction gas are prevented from entering the space where the heater unit 7 is arranged from the first space P1 and the second space P2, the fourth separation gas can prevent the first reaction gas and the second reaction gas from being adsorbed onto the heater unit 7.

A description is given of a part provided outside the vacuum chamber 1 and a part for performing a conveyance between the part provided outside the vacuum chamber 1.

Figure 10:
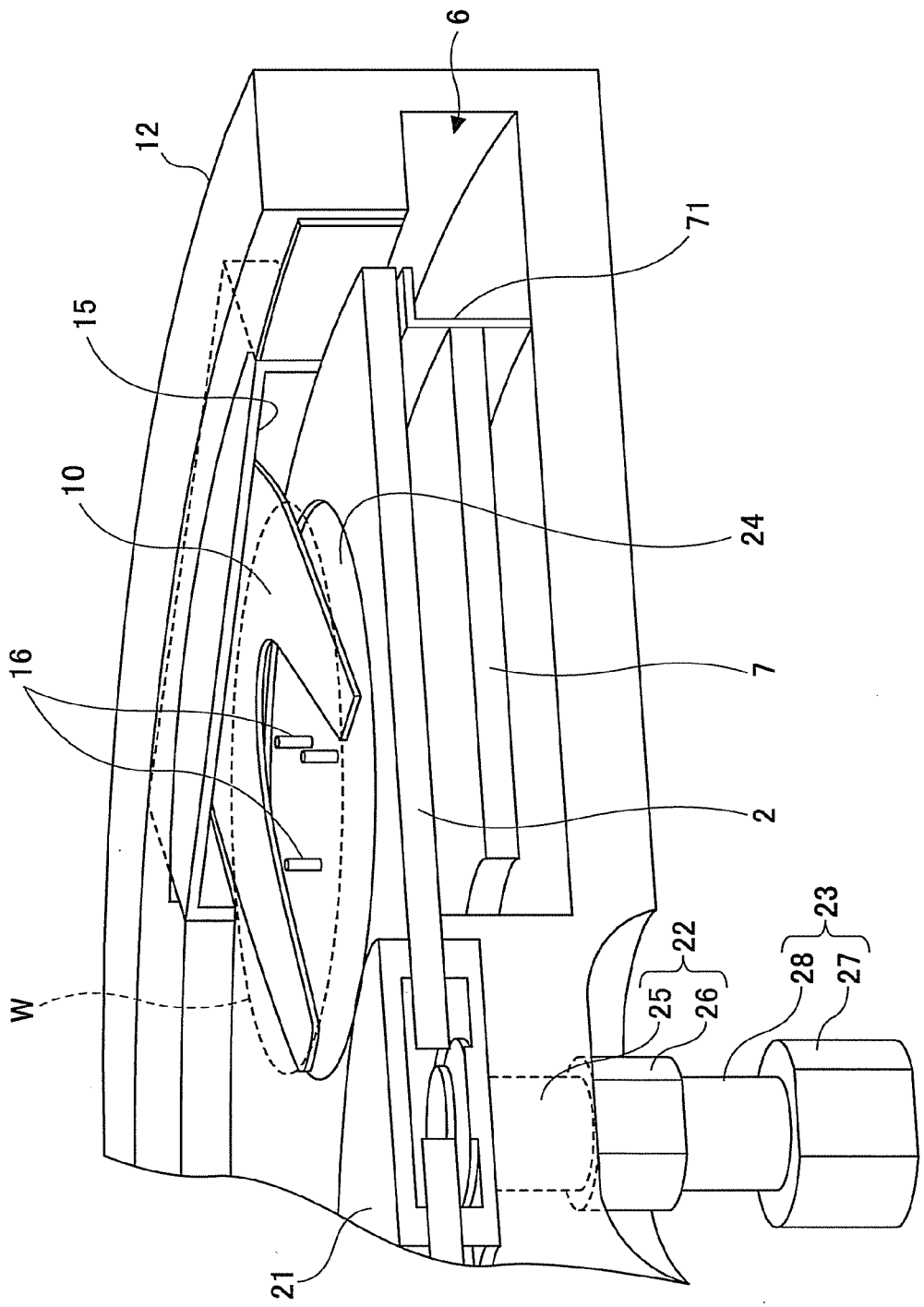
FIG. 10 is a partly cut-away perspective view of the film deposition apparatus according to the first embodiment of the present invention.

As illustrated in FIG. 2, FIG. 3 and FIG. 10, a conveyance port 15 for transferring a wafer between an external conveyance arm 10 and the turntable 2 is formed in the side wall of the vacuum chamber 1. The conveyance port 15 is opened and closed by a gate valve which is not illustrated in the figures. Because a transfer of the wafer W is performed between the conveyance arm 10 at the position of the conveyance port 15 in the concave portion 24, which is the substrate placement part, on the turntable 2, a lifting mechanism for lifting pins 16 is provided at a position corresponding to a transfer position under the turntable 2, the lifting pins 16 penetrating the concave portion 24 to lift the wafer from a backside of the wafer.

Figure 11:
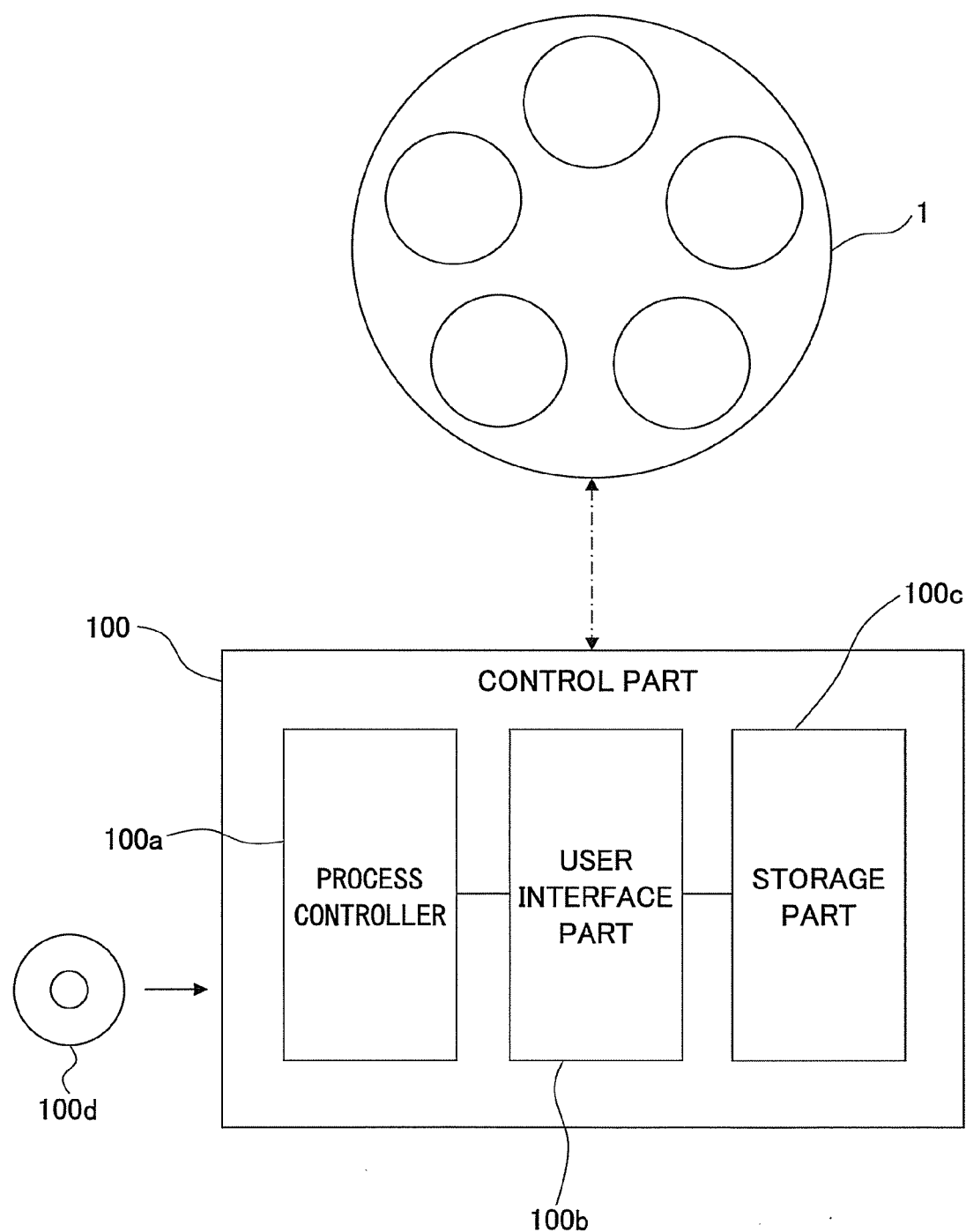
FIG. 11 is an illustration illustrating a structure of a control part of the film deposition apparatus according to the first embodiment of the present invention.

The film deposition apparatus according to the present embodiment is provided with the control part 100 including a computer for controlling an operation of the entire apparatus, as illustrated in FIG. 1 and FIG. 3. As illustrated in FIG. 11, the control part 100 is provided with a process controller 100a including a CPU to control each part of the film deposition apparatus 100, a user interface part 100b, and a memory part 100c. The user interface part 100b includes a keyboard for performing a command input operation for managing the film deposition apparatus by a process manager, and a display for visualizing and displaying an operating condition of the film deposition apparatus. The memory device 100c stores a control program (software) for achieving various processes performed by the film deposition apparatus by a control of the process controller 100a, and a recipe that stores process condition data or the like. A desired process is performed by the film deposition apparatus by retrieving an arbitrary recipe from the memory part 100c according to an instruction from the user interface part 10b and causing the process controller to execute the recipe under a control of the process controller 100a. The control program and the recipe of process condition data may be stored in a computer readable storage medium 100d (for example, a hard disk, a compact disc, a magneto optical disk, a memory card, a flexible disk, or the like) and installed into the memory part 100c, or the programs and recipe may be transferred, as needed, from other apparatuses through an exclusive line to achieve an online use.

A description will be given, with reference to FIG. 10 and FIG. 12, of a film deposition method using the film deposition apparatus according to the present embodiment.

Figure 12:
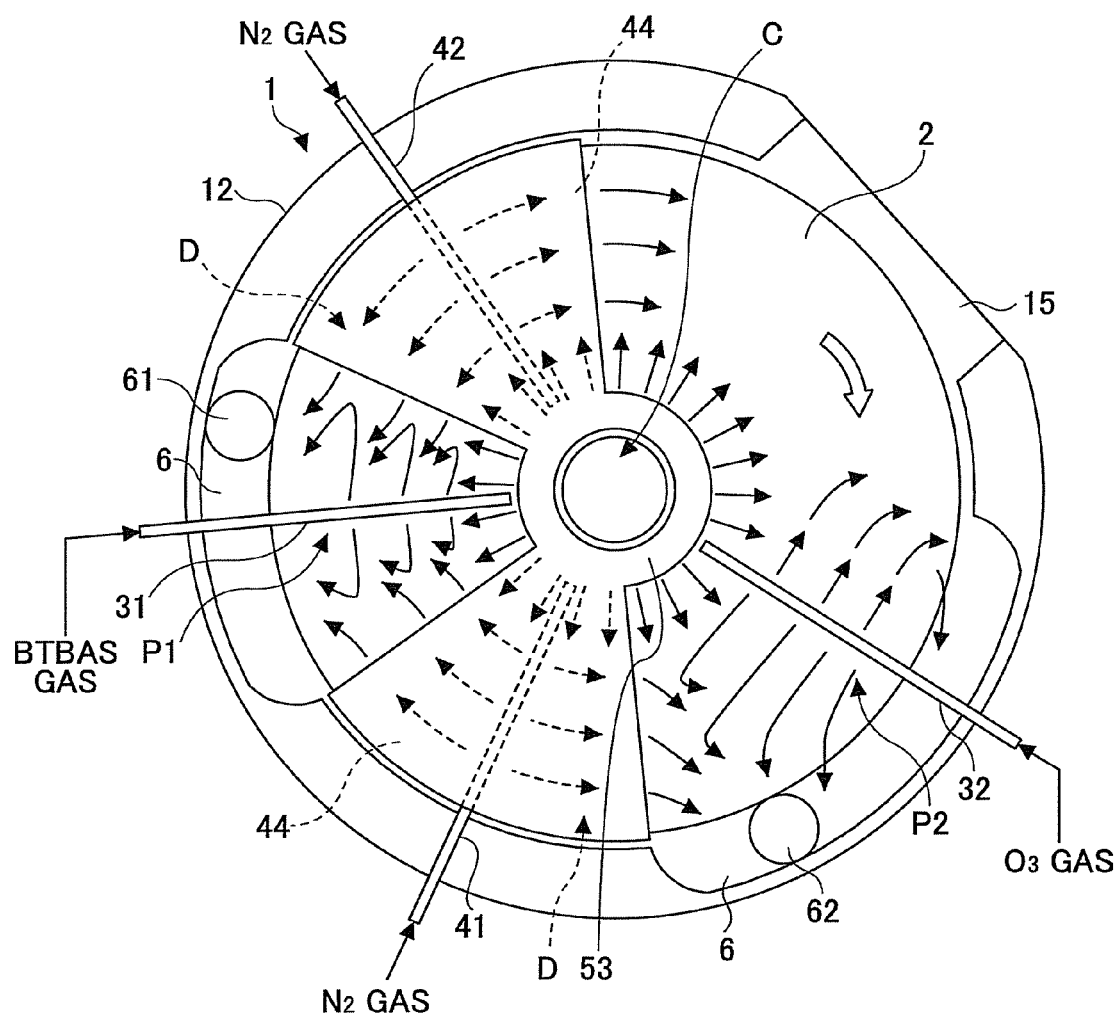
FIG. 12 is an illustration illustrating a condition of flows of a first reaction gas, a second reaction gas and a first separation gas in the film deposition apparatus according to the first embodiment of the present invention.

FIG. 12 is an illustration for explaining the film deposition method using the film deposition apparatus according to the present embodiment, which illustrates flows of the first reaction gas, the second reaction gas and the first separation gas. FIG. 12 is a cross-sectional view of the ceiling plate 11 of the vacuum chamber 1 along a plane lower than the first bottom surface part 45 and the second bottom surface part 45a and higher than the first separation gas supply parts 41 and 42.

First, as illustrated in FIG. 10, the gate valve is opened and the wafer W is transferred by the transfer arm 10 to the concave portion 24 of the turntable 2 through the conveyance port 15 from an exterior. The transfer is performed by the lifting pins 16 moving up and down through the penetration holes of the bottom surface of the concave portion 24 from the bottom side of the vacuum chamber 1 when the concave portion 24 is stopped at a position facing the conveyance port 15. Such a transfer of the wafer W is carried out while rotating the turntable 2 intermittently to sequentially place the wafers W in the five concave portions 24 of the turntable 2.

Then, gases in the vacuum chamber 1 are evacuated by the vacuum pump 64 to form a predetermined vacuum pressure in the vacuum chamber 1, and the second separation gas, third separation gas, and fourth separation gas are supplied to the vacuum chamber 1 from the first separation gas supply parts 41 and 42, the second separation gas supply part 51, the third separation gas supply part 72, and the fourth separation gas supply part 73.

Then, the wafer (substrate) W is heated by the heater unit 7. After the wafer W is placed on the turntable 2, the wafer W is heated, for example, at 300° C. by the heater unit 7. On the other hand, the turntable 2 is heated previously, for example, at 300° C. by the heater unit 7, and the process of heating the wafer W can be carried out by placing the wafer W on the turntable 2.

Then, the first reaction gas and the second reaction gas are supplied from the first reaction gas supply part 31 and the second reaction gas supply part 32, respectively. That is, BTBAS gas and $O_3$ gas are discharged from the first reaction gas supply part 31 and the second reaction gas supply part 32, respectively. At this time, it is checked whether the temperature of the wafer W is constant at a setting temperature by measuring the temperature by a temperature sensor.

Because each wafer W alternately passes through the first space P1, where the first reaction gas supply part 31 is provided, and the second space P2 where the second reaction gas supply part 32, BTBAS gas is adsorbed onto the wafer W, and, then, $O_3$ gas is adsorbed onto the wafer W. Thus, BTBAS molecules are oxidized, and a single molecular layer or a plurality of molecular layers of silicon oxide is formed on the wafer W. The molecular layers of silicon oxide are sequentially laminated, and, thereby, a silicon oxide film of a predetermined thickness is formed on the wafer W.

At the same time, $N_2$ gas, which is a separation gas, is supplied also from the second separation gas supply part 51. Thereby, $N_2$ gas is discharged along the surface of the turntable 2 from the central part area C, that is, from a space between the projection part 53 and the central part of the turntable 2. As mentioned above, in the present embodiment, a portion of the inner wall of the vacuum chamber 1, which portion extends along a space under the first bottom surface part 45 and the second bottom surface part 45a where the first reaction gas supply part 31 and the second reaction gas supply part 32 are arranged, is cut out and a large space is formed. Because the exhaust ports 61 and 62 are located under this large space, a pressure in the space under the first bottom surface part 45 and the second bottom surface part 45a is lower than a pressure of each of the thin or narrow space under the third bottom surface part 44 and the above-mentioned central part area C. This is because the thin or narrow space under the third bottom surface part 44 is formed so that a pressure in the space where the first (second) reaction gas supply part 31 (32) or a pressure difference between the first (second) space P1 (P2) can be maintained by the third height H3.

Flows of the gases discharged from each part are illustrated in FIG. 12. The $O_3$ gas, which is discharged downward from the second reaction gas supply part 32, hits the surface of the turntable 2 and flows along the surface of the turntable 2 toward an upstream side in the rotating direction. The $O_3$ gas flowing toward the upstream side is pushed back by the $N_2$ gas flowing from the upstream side in the rotating direction. Thus, the $O_3$ gas flows between the circumferential edge of the rotation table 2 and the inner wall of the vacuum chamber 1 and, then, flows into the exhaust space 6 and is exhausted through the exhaust port 62.

Additionally, the $O_3$ gas, which is discharged downward from the second reaction gas supply part 32, hits the surface of the turntable 2, flows along the surface of the turntable 2 toward an upstream side in the rotating direction, and tends to flow toward the exhaust port 62 due to the flow of the $N_2$ gas discharged from the central part area C and suctioning by the exhaust port 62. However, a part of the $O_3$ gas flows toward the third space D located on the downstream side, and tends to flow into a space under the third bottom surface part of a sectoral shape. However, the height and the length, which is measured in the rotating direction, of the third bottom surface part 44 are set so that a gas is prevented from flowing under the third bottom surface part 44 under process parameters at a time of operation including a flow rate of each gas. Thus, as also illustrated in FIG. 5B, the $O_3$ gas rarely flows under the third bottom surface part 44, or only a small part of the $O_3$ gas may flow under the third bottom surface part 44 but cannot reach a position close to the first separation gas supply part 41. That is, the $O_3$ gas is pushed back to the upstream side in the rotating direction, that is, to the second space P2 side, by the $N_2$ gas discharged from the first separation gas supply part 42. Thereby, the $O_3$ gas flows between the circumferential edge of the turntable 2 and the inner wall of the vacuum chamber 1 together with the $N_2$ gas discharged from the central part area C, and, then, flows into the exhaust space 6 and is exhausted through the exhaust port 62.

The BTBAS gas, which is discharged downward from the first reaction gas supply part 31 and flows along the surface of the turntable 2 in directions toward the upstream side and the downstream side in the rotating direction, cannot flow under the third bottom surface parts 44 located on the upstream side and the downstream side. Alternatively, if the BTBAS gas enters the space under the third bottom surface part 44, the BTBAS is pushed back to the first space P1 side, and is exhausted to the exhaust port 61 through the exhaust space 6 together with the $N_2$ gas discharged from the central part area C. That is, each third space D prevents the BTBAS gas and the $O_3$ gas, which are the reaction gases flowing in the atmosphere, from entering therein, but gas molecules adsorbed onto the wafer can pass through the separation area, that is, under the third bottom surface part 44, which contributes to the film deposition.

The BTBAS gas of the first space P1 and the $O_3$ gas of the second space P3 tend to enter the central part area C. However, because the second separation gas is discharged from the central part area C toward the circumferential edge of the turntable 2, the BTBAS gas and the $O_3$ gas are prevented from entering the central part area C by the second separation gas. Alternatively, if a small part of the BTBAS gas or the $O_3$ gas enters the central part area C, the gas is pushed back by the second separation gas. Thus, the BTBAS gas and the $O_3$ gas are prevented from entering the first space P1 and the second space P2 by passing through the central part area C.

In the third space D, the sectoral circumferential edge part of the ceiling plate 11 is bent downward and a gap between the bent part 46 and the outer edge surface of the turntable 2 is narrow as mentioned above, thereby preventing passage of a gas. Accordingly, the BTBAS gas of the first space P1 (the $O_3$ gas of the second space P2) is also prevented from flowing into the second space (the first space P1). Thus, the atmosphere of the first space P1 and the atmosphere of the second space P2 are completely separated by the two third spaces D, and the BTBAS gas is exhausted by the exhaust port 61 and the $O_3$ gas is exhausted by the exhaust port 62. As a result, the BTBAS gas, which is the first reaction gas, and the O3 gas, which is the second reaction gas, are not mixed with each other in the atmosphere or on the wafer. In addition, in this example, because the $N_2$ gas, which is the second separation gas, is supplied to the side under the turntable 2, for example, the BTBAS gas as the first reaction gas flowing into the exhaust space 6 cannot flow into the supply area of the $O_3$ gas as the second reaction gas by passing through the side under the turntable 2.

Here, an example of process parameters is explained. If a wafer W of a diameter of 300 mm is used as a substrate to be processed, the rotational speed of the turntable 2 is, for example, 1 rpm to 500 rpm. A process pressure is, for example, 1067 Pa (8 Torr). A heating temperature of the wafer W is, for example, 350 degrees C. Flow rates of BTBAS gas and $O_3$ gas are, for example, 100 scam and 10000 sccm, respectively. A flow rate of $N_2$ gas from the second separation gas supply part 51 at the central part of the vacuum chamber 1 is, for example, 5000 sccm. Moreover, although a number of reaction gas supply cycles with respect to a single wafer, that is, a number of times of a wafer passing each of the first space P1 and the second space P2, changes according to a target film thickness, it is 600 times, for example.

According to the present embodiment, because a so-called ALD (or so-called MLD) is performed by arranging a plurality of wafers W in the rotating direction of the turntable 2 and rotating the turntable to have each wafer W sequentially pass through the first space P1 and the second space P2, a film deposition process can be performed with a high throughput. The third space D having the low ceiling surface is provided between the first space P1 and the second space P2 in the rotating direction of the turntable 2, and the separation gas is discharged from the central part area C, which is defined by the rotation center part of the turntable 2 and the vacuum chamber 1 toward the circumferential edge of the turntable 2. The reaction gases are exhausted through the gap between the circumferential edge of the turntable 2 and the inner wall of the vacuum chamber 1 together with the separation gas diffusing to both sides of the third space D and the separation gas discharged from the central part area C. Thus, the reaction gases are prevented from being mixed with each other. As a result, a good film deposition process can be achieved, and generation of reaction products on the turntable 2 is suppressed as much as possible, which suppresses generation of particles. It should be noted that the present invention is applicable to a case where a single wafer W is placed on the turntable 2.

As reaction gases used in the present invention other than the above-mentioned gases, there are DCS (dichlorosilane), NCD (hexachlorodisilane), TMA (Trimethyl Aluminum), 3DMAS (tris(dimethyl amino) silane), TEMAZ (tetrakis-ethyl-methyl-amino-zirconium), TEMH (tetrakis-ethyl-methyl-amino-hafnium), Sr $(THD)_2$ (bis (tetra methyl heptandionate) strontium), Ti(MPD) (THD)$_2$ (methyl-pentadionate) (bis-tetra-methyl-heptandionate) titanium), monoaminosilane, etc.

As mentioned above, according to the film deposition apparatus according to the present embodiment, a high throughput is obtained, and a plurality reaction gases are prevented from being mixed with each other on a substrate, which enables a good process to be carried out. Additionally, a transfer of the substrate can be surely performed between an interior and an exterior of the vacuum chamber.

Although two kinds of reaction gases are used in the film deposition apparatus according to the present embodiment, the present invention is not limited to the use of two-kinds of reaction gases, and is applicable to a case where more than three kinds of reaction gases are sequentially supplied onto a substrate. For example, when using three kinds of reaction gases, that are a first reaction gas, a second reaction gas and a third reaction gas, the areas of the bottom surface of the ceiling plate 11 including gas supply parts of each gas may be formed by arranging a first reaction gas supply part, a first separation gas supply part, a second reaction gas supply part, a first separation gas supply part, a third reaction gas supply part and a first separation gas supply part, in that order, in a circumferential direction of the vacuum chamber 1.

Although a closed loop controlled servo motor is used as the motor for driving the turntable 2, the motor is not limited to the servo motor if the rotation shaft of the turntable and the drive shaft of the motor can be coupled without slip. For example, an open loop controlled stepping motor, of which encoder value is accurately monitored by software, or a direct drive motor having a rotation shaft, which can be directly connected to the rotation shaft of the turntable without reduction gears, may be used.

Figure 13:
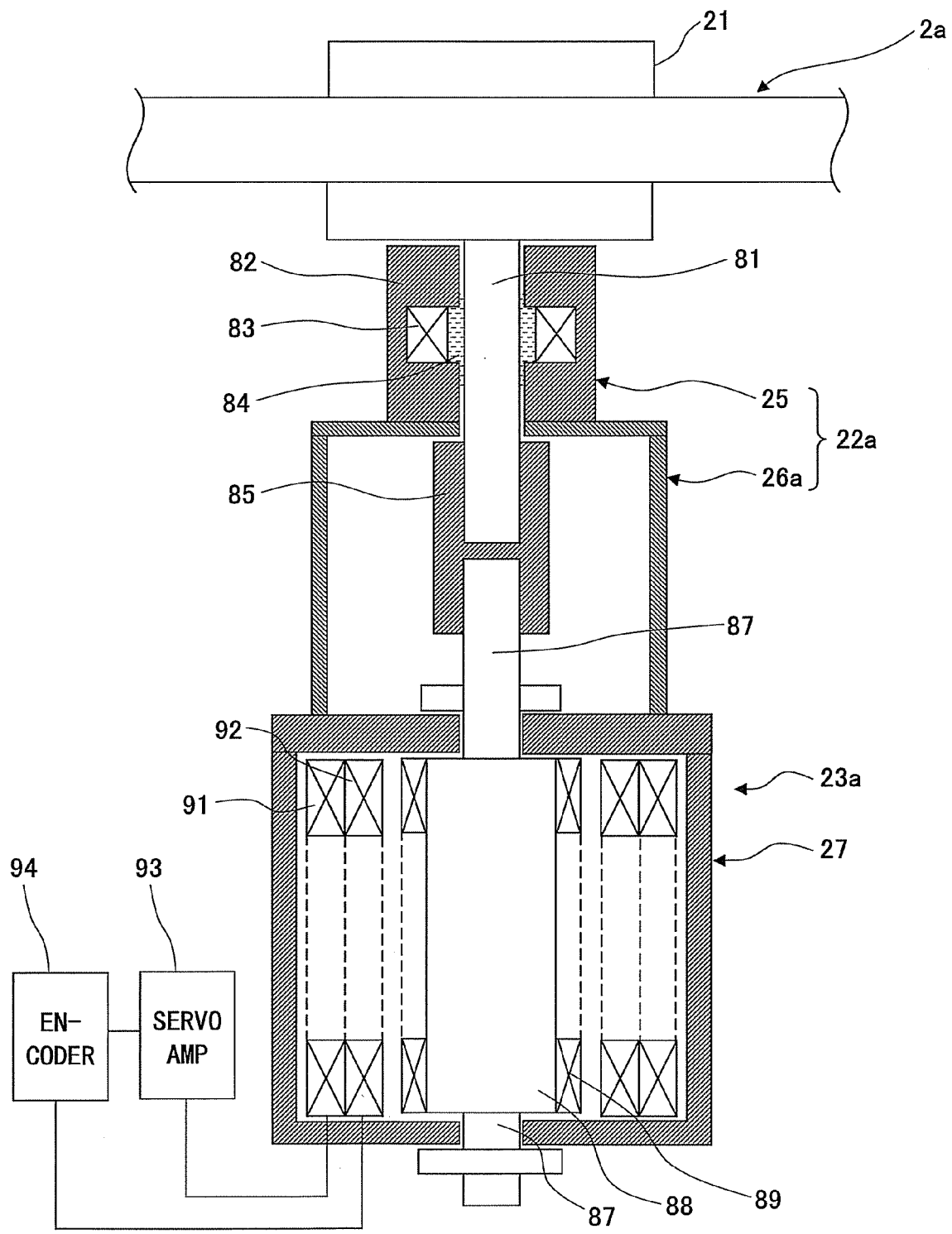
FIG. 13 is a cross-sectional view of a turntable in a film deposition apparatus according to a first variation of the first embodiment of the present invention.

A description will be given, with reference to FIG. 13, of a film deposition apparatus according to a first variation of the first embodiment of the present invention. FIG. 13 is a view for explaining the film deposition apparatus according to the present variation, and is a cross-sectional view illustrating a structure of the turntable. In the following description, parts that are explained before are given the same reference numerals, and descriptions thereof may be omitted (the same applies to the variations and embodiments mentioned later). The film deposition apparatus according to the present embodiment differs from the film deposition apparatus according to the first embodiment in a point that the turntable 2 is directly coupled with the servo motor without a reduction apparatus (reduction gears).

Different from the first embodiment in which the rotating part of the turntable 2 is driven by the servo motor via the reduction apparatus, in the present variation, a rotation part 22a of a turntable 2a is directly coupled with the servo motor 27. The turntable 2a is equipped with a rotation part 22a and a drive part 23a, which are different from the first embodiment. The drive part 23a includes the servo motor 27 without a reduction apparatus. The servo motor 27 has the same structure as that of the first embodiment. The rotation part 22a is equipped with a bearing part 25 and a coupling part 26a. Similar to the first embodiment, the bearing part 25 and the coupling part 26a are provided, in that order from the top, under the rotation center of the turntable 2a. The bearing part 25 also has the same structure as that of the first embodiment. On the other hand, in the coupling part 26a, the rotation shaft 81 of the turntable 2a and the drive shaft 87 of the servo motor 27 are coupled with each other using the joint 85 without slip. Here, the expressing "without slip" means that the rotation shaft 81 and the drive shaft 87 is mechanically fixed firmly, and there is no slip or play between the rotation shaft 81 and the drive shaft 87.

In the present variation, the turntable 2a made of carbon and having a diameter of 960 mm and a thickness of 20 mm is used. Thus, if the servo motor 27 having an input voltage of 200 V and a maximum power consumption of 1000 W is used, a sufficiently large torque can be obtained with respect to inertia of the turntable 2a without using a reduction apparatus, which allows the turntable 2a to be rotated without slip and a loss of synchronism in the servomotor 27.

Although a closed loop controlled servo motor is used as the motor for driving the turntable 2a, the motor is not limited to the servo motor if the rotation shaft of the turntable and the drive shaft of the motor can be coupled without slip. For example, an open loop controlled stepping motor, of which encoder value is accurately monitored by software, may be used.

Figure 14:
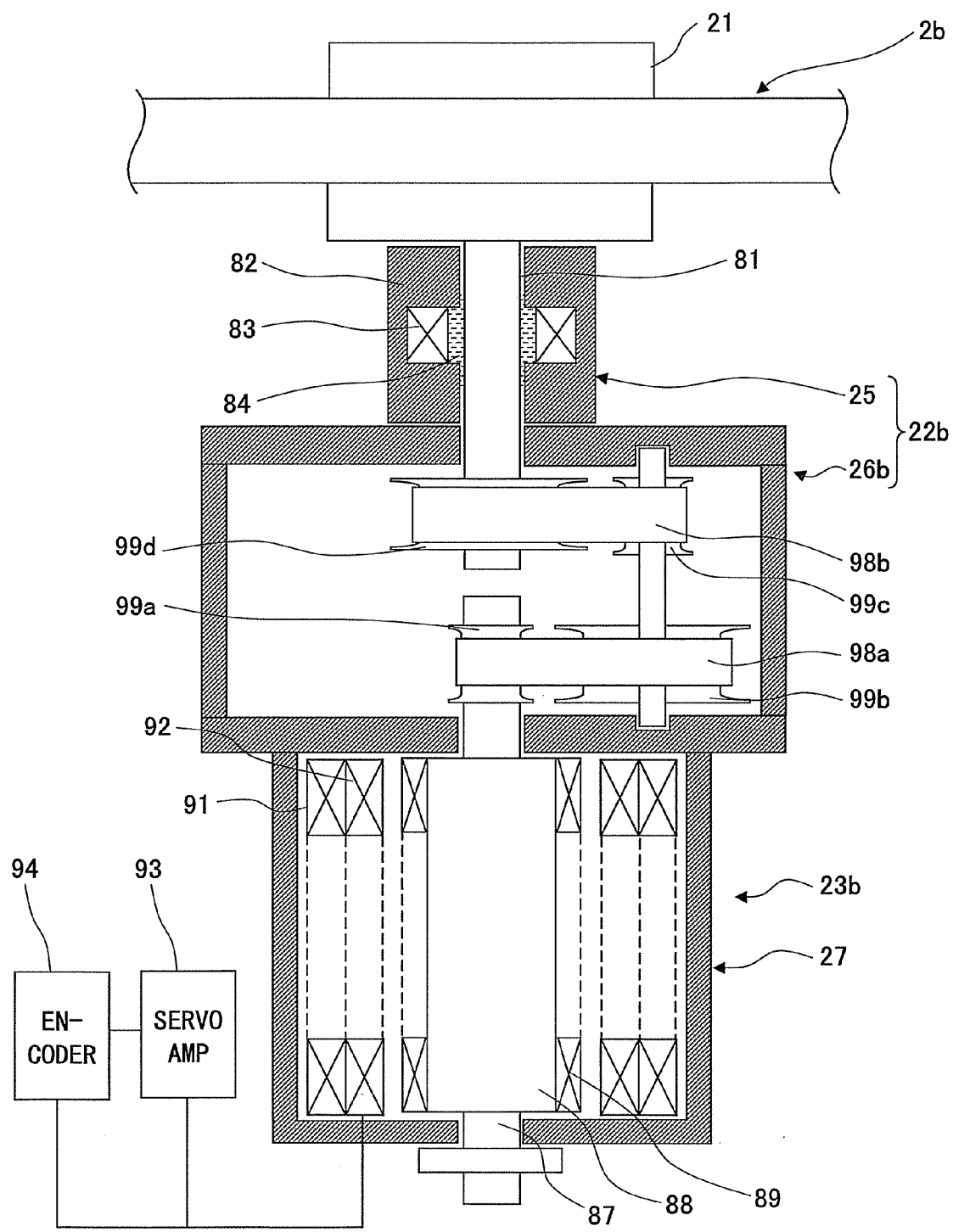
FIG. 14 is a cross-sectional view of a turntable in a film deposition apparatus according to a second variation of the first embodiment of the present invention.

A description will now be given, with reference to FIG. 14, of a film deposition apparatus according to a second variation of the first embodiment of the present invention. FIG. 14 is a view for explaining the film deposition apparatus according to the present variation, and is a cross-sectional view illustrating a structure of the turntable. The film deposition apparatus according to the present embodiment differs from the film deposition apparatus according to the first variation of the first embodiment in that a power of the servo motor is transmitted to the turntable via a belt.

Different from the first variation of the first embodiment in which the rotating part of the turntable 2 is coupled to the servo motor via the joint, in the present variation, a power of the servo motor 27 is transmitted to the rotation part 22b of the turntable 2b via belts. The turntable 2b is equipped with a rotation part 22b and a drive part 23b, which are different from the first embodiment. The drive part 23b includes the servo motor 27 without a reduction apparatus. The rotation part 22b is equipped with a bearing part 25 and a coupling part 26b. Similar to the first embodiment, the bearing part 25 and the coupling part 26b are provided, in that order from the top, under the rotation center of the turntable 2b, and the bearing part 25 also has the same structure as that of the first embodiment. The coupling part 26b is for transmitting a drive power of the servo motor 27 to the rotation shaft 81 of the turntable 2b. The coupling part 26b can transmit a drive power of the servo motor 27 to the rotation shaft 81 of the turntable 2b by belts 98a and 98b and pulleys 99a/99b, 99c and 99d.

In the present variation, the turntable 2b made of carbon and having a diameter of 960 mm and a thickness of 20 mm is used. Thus, if the servo motor 27 having an input voltage of 200 V and a maximum power consumption of 1500 W is used, a sufficiently large torque can be obtained with respect to inertia of the turntable 2b without using a reduction apparatus, which allows the turntable 2b to be rotated without slip and a loss of synchronism in the servo motor 27.

Because the rotation torque is sufficiently large and the inertia of the turntable 2b is small, a rotational position of the turntable can be accurately controlled at a time of starting rotation and at a time of stopping rotation according to the driving method using belts. That is, because the belts used in the present variation are very short, there is no slip generated due to an elongation of the belts. Accordingly, a rotation of the drive shaft 87 can be transmitted to the rotation shaft 81 via the belts, and a number of parts can be reduced as compared to a case where a reduction apparatus using gears is provided.

Although a closed loop controlled servo motor is used as the motor for driving the turntable 2a, the motor is not limited to the servo motor if the rotation shaft of the turntable and the drive shaft of the motor can be coupled via a belt without slip. For example, an open loop controlled stepping motor, of which the encoder value is accurately monitored by software, may be used.

Figure 15:
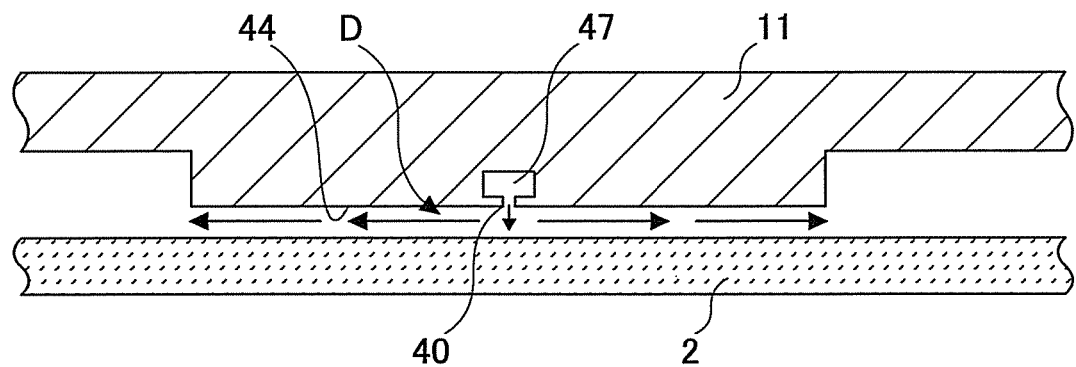
FIG. 15 is a cross-sectional view of a ceiling plate in a third bottom surface part in a film deposition apparatus according to a third variation of the first embodiment of the present invention.

A description will be given, with reference to FIG. 15, of the film deposition apparatus according to a third variation of the first embodiment of the present invention. FIG. 15 is an illustration for explaining the film deposition apparatus according to the present variation, and is a cross-sectional view illustrating another example of the shape of the ceiling plate in the third bottom surface part. The film deposition apparatus according to the present variation differs from the film deposition apparatus according to the first embodiment in a point that a flow passage 47 is formed to extend in a radial direction of the turntable 2 inside the ceiling plate 11 in the third space D.

Different from the first embodiment in which a groove is formed in a portion corresponding to the first separation gas supply part so that the third bottom surface part is arranged on both sides of the first separation gas supply part, in the present variation, the flow passage 47 for the first separation gas is formed to extend in a radial direction of the turntable 2 inside the ceiling plate 11 of the vacuum chamber 1 in the third space D. Many gas discharge holes 40 are provided in a bottom part of the flow passage 47 along a longitudinal direction thereof. Accordingly, there is no need to provide the first separation gas supply part other than the flow passage, and the same effect as the first embodiment can be obtained and a number of parts can be reduced.

Figure 16A:
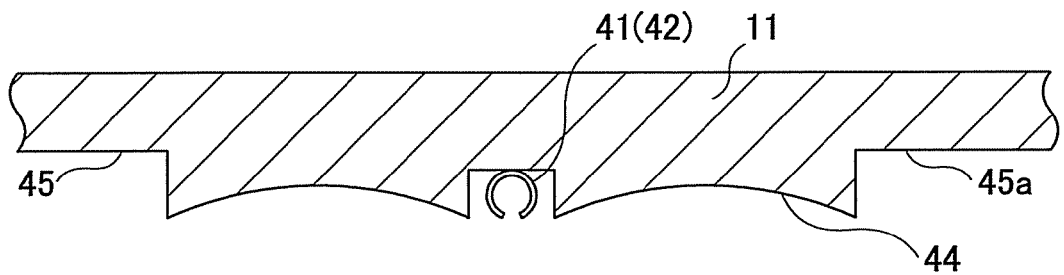
FIGS. 16A through 16C are cross-sectional views of the ceiling plate in the third bottom surface part in a film deposition apparatus according to a fourth variation of the first embodiment of the present invention.
Figure 16B:
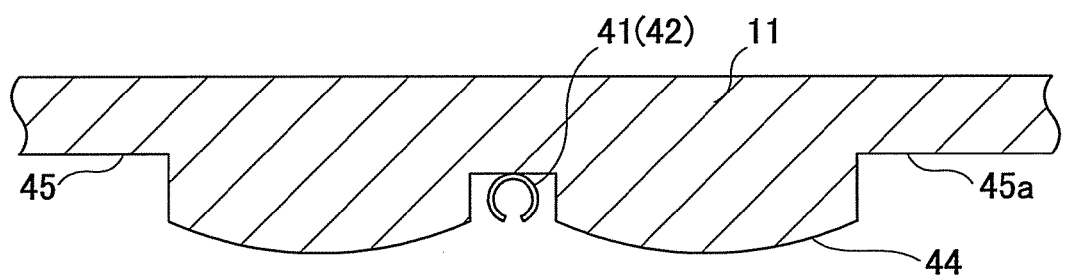
Figure 16C:
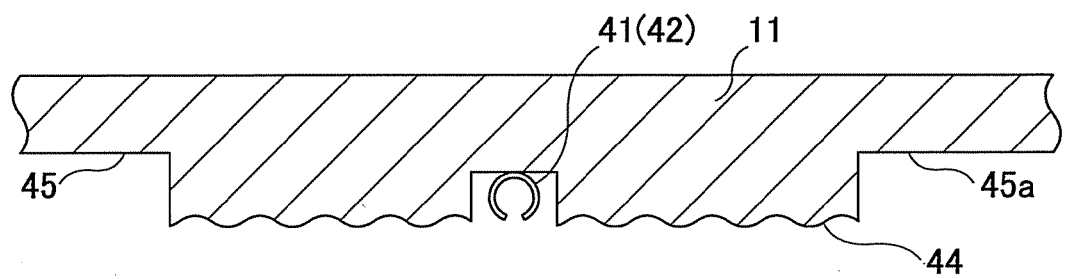

A description will be given, with reference to FIG. 16A through FIG. 16C, of a film deposition apparatus according to a fourth variation of the first embodiment of the present invention. FIGS. 16A through 16C are illustrations for explaining the film deposition apparatus according to the present variation, and are cross-sectional views illustrating other examples of the shape of the bottom surface of the ceiling plate in the third bottom surface part. The film deposition apparatus according to the present variation differs from the film deposition apparatus according to the first embodiment in that the third bottom surface part in the third space D is a curved surface.

Referring to FIG. 16A through FIG. 16C, different from the first embodiment in which the third bottom surface part 44 on both sides of the first separation gas supply part 41 is a flat surface, in the present variation, the third bottom surface part 44 on both sides of the first separation gas supply part 41 is a curved surface.

The third bottom surface part 44 is not limited to a flat surface as it is in the first embodiment. The only limitation is that the third bottom surface part 44 must be able to separate the first reaction gas and the second reaction gas. The third bottom surface part 44 may be, for example, a concave surface as illustrated in FIG. 16A, may be for example, a convex surface as illustrated in FIG. 16B, or may be, for example, a wavy surface as illustrated in FIG. 16C. In the case of a concave surface as illustrated in FIG. 16A, the first reaction gas and the second reaction gas are efficiently prevented from entering the third bottom surface part 44 because the height from the turntable 2 to the third bottom surface part 44 can be decreased in an edge part where the third bottom surface part 44 is adjacent to the first bottom surface part 45 or the second bottom surface part 45a. In the case of a convex surface as illustrated in FIG. 16B, the first reaction gas and the second reaction gas are efficiently prevented from entering the third bottom surface part 44 because the height from the turntable 2 to the third bottom surface part 44 can be decreased at a position in the third bottom surface part 44 corresponding to a top of the convex surface. In the case of a wavy surface as illustrated in FIG. 16C, the first reaction gas and the second reaction gas are efficiently prevented from entering the third bottom surface part 44 because this case corresponds to a case for which a plurality of tops such as illustrated in FIG. 16B are provided. In addition, although the third bottom surface part 44 is a part of the bottom surface of the ceiling plate 11, a bottom surface of a member separate from the ceiling plate 11 may be formed in the above-mentioned shape and such a member may be attached to the ceiling plate 11.

Figure 17A:
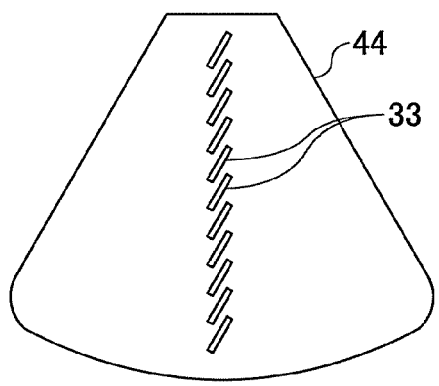
FIGS. 17A through 17G are bottom views of other examples of the shape of gas discharge holes of a first reaction gas supply part in a film deposition apparatus according to a fifth variation of the first embodiment of the present invention.
Figure 17B:
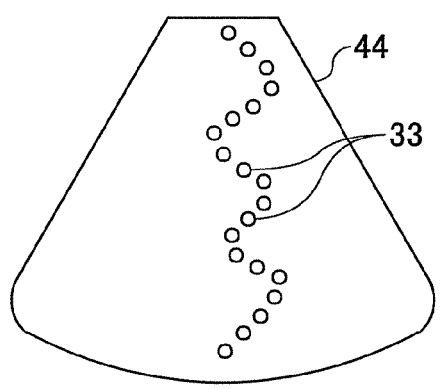
Figure 17C:
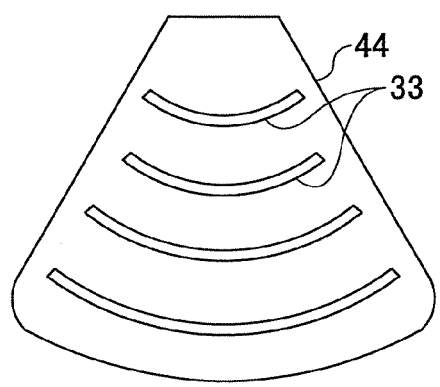

A description will be given, with reference to FIG. 17A through FIG. 17G, of a film deposition apparatus according to a fifth variation of the first embodiment of the present invention. FIG. 17A through FIG. 17C are illustrations for explaining the film deposition apparatus according to the present variation, and are bottom views illustrating other examples of the shape of the gas discharge hole of the first reaction gas supply part. FIG. 17D through FIG. 17G are illustrations for explaining the film deposition apparatus according to the fifth variation of the first embodiment of the present invention, and are bottom views of other examples of the shape of the third bottom surface part. In FIG. 17A through FIG. 17C, the third bottom surface part 44 and the discharge holes 33 are illustrated. The film deposition apparatus according to the present variation differs from the film deposition apparatus according to the first embodiment in that the discharge holes formed in the first separation gas supply part are not arranged along a straight line extending from a circumferential edge to the rotation center of the turntable 2.

Different from the configuration in which the discharge holes formed in the first separation gas supply part are arranged along a straight line extending from a circumferential edge to the rotation center of the turntable 2, in the present variation, the discharge holes are not arranged along a straight line extending from a circumferential edge to the rotation center of the turntable 2. If the discharge holes 33 can supply the first separation gas uniformly to a substrate, they are not limited to the arrangement along a straight line extending from a circumferential edge to the rotation center of the turntable 2, and may be arranged as mentioned below.

As illustrated in FIG. 17A, many discharge holes 33 formed as rectangular slits oblique to a radial line of the turntable 2 may be arranged in a radial direction at predetermined intervals. As illustrated in FIG. 17B, many discharge holes 33 having a circular shape may be arranged along a serpentine line. As illustrated in FIG. 17C, many discharge holes 33 formed as arc shaped slits may be arranged concentrically with respect to the rotation center of the turntable 2.

The third bottom surface part 44 may be hollow so that the first separation gas is introduced into a cavity. Also in this case, a plurality of discharge holes 33 may be arranged as illustrated in FIG. 17A, FIG. 17B and FIG. 17C.

Figure 17D:
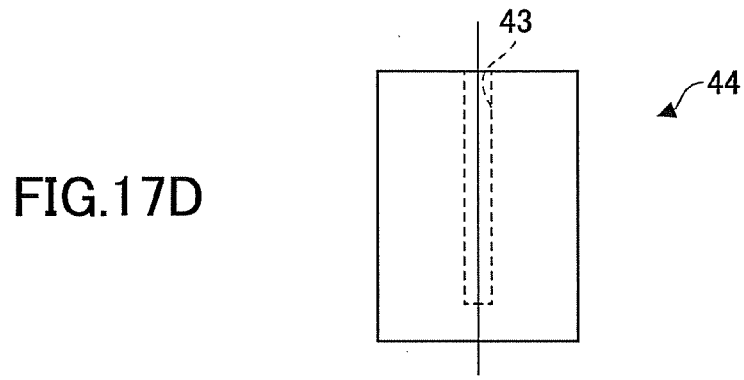
Figure 17E:
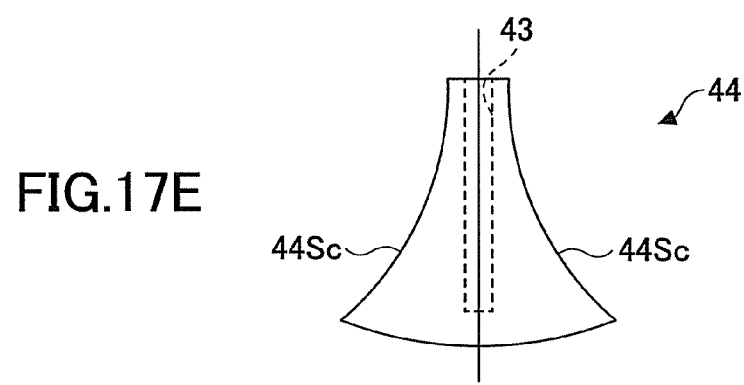
Figure 17F:
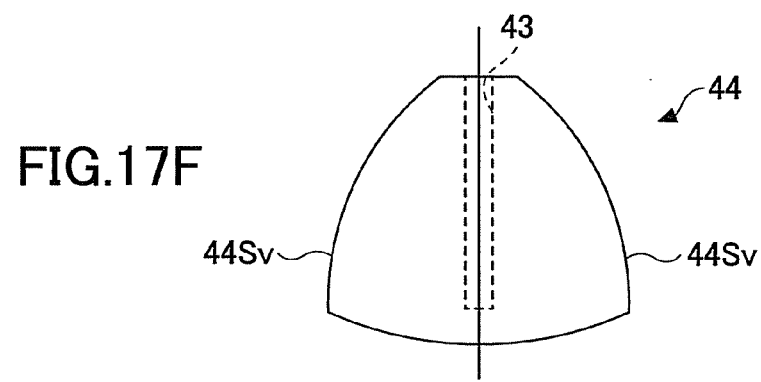
Figure 17G:
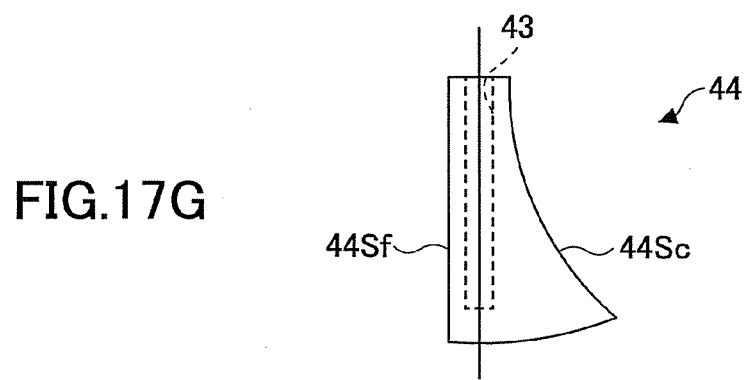

Although the third bottom surface part 44 has a generally sectoral shape in the present variation, the third bottom surface part 44 may have a square shape or a rectangular shape as illustrated in FIG. 17D. The top surface of the third bottom surface part 44 may have a sectoral shape in its entirety and the third bottom surface part 44 may have side surfaces 44Sc curved in a concave shape, as illustrated in FIG. 17E. Additionally, the top surface of the third bottom surface part 44 may have a sectoral shape in its entirety and the third bottom surface part 44 may have side surfaces 44Sv curved in a convex shaper as illustrated in FIG. 17F. Further, as illustrated in FIG. 17G, a portion of the third bottom surface part 44 on the upstream side in the rotating direction of the turntable 2 (FIG. 1) may have a side surface 44Sc and a portion of the third bottom surface part 44 on the downstream side in the rotating direction of the turntable 2 (FIG. 1) may have a flat side surface 44Sf. It should be noted that, in FIG. 17D through FIG. 17G, dashed lines indicate the groove part 43 (FIG. 4A and FIG. 4B) formed in the third bottom surface part 43. In these cases, the first separation gas supply parts 41 and 42 (FIG. 2) may extend from a central part of the vacuum pump 1, that is, from the projection part 53 (FIG. 1). According to the above-mentioned arrangements of the discharge holes 33, the first separation gas is more uniformly supplied in the third bottom surface part 44, thereby more efficiently preventing the first reaction gas and the second reaction gas from entering the third bottom surface part 44.

Figure 18:
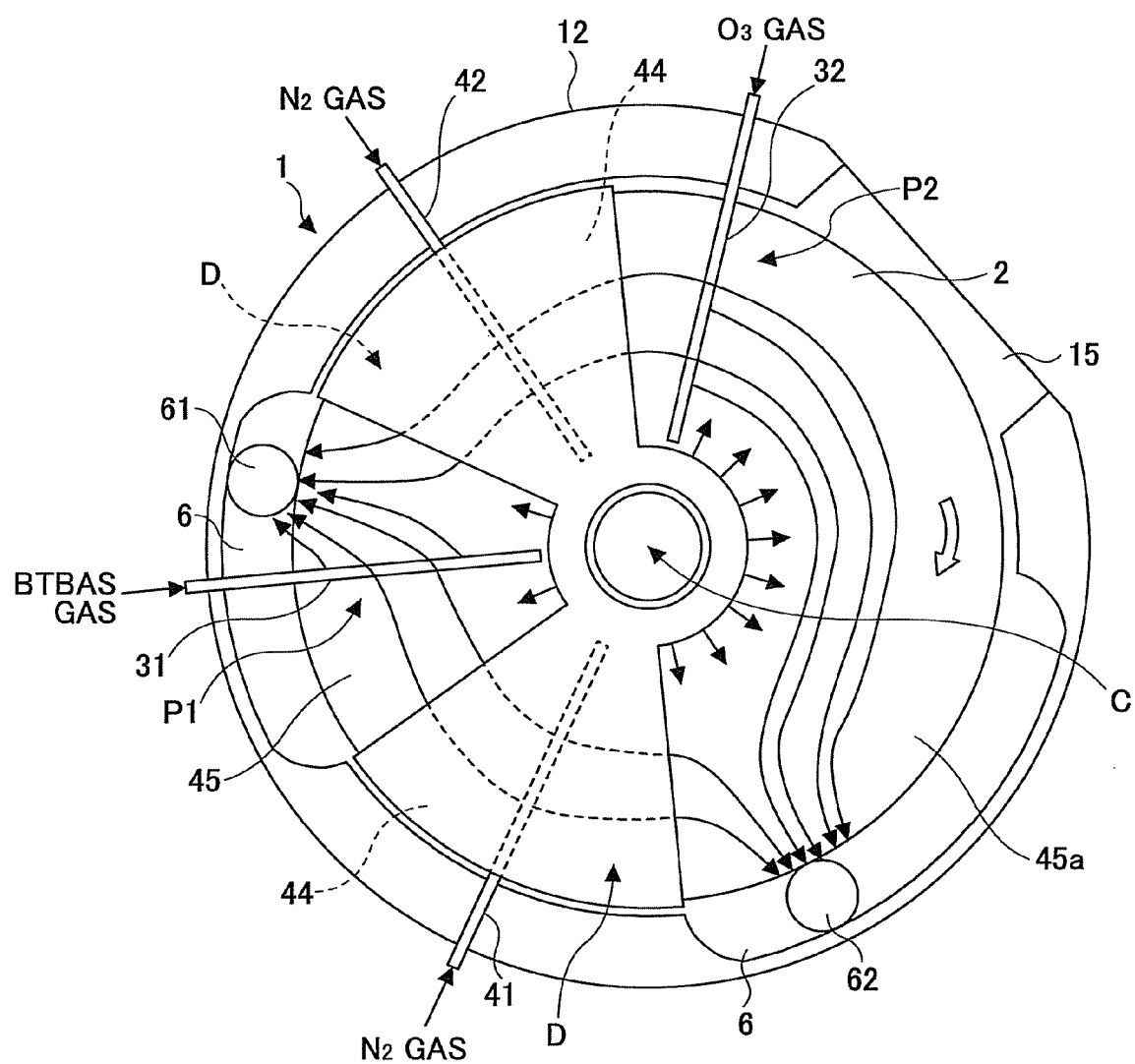
FIG. 18 is a plan view of a film deposition apparatus according to a sixth variation of the first embodiment of the present invention.

A description will now be given, with reference to FIG. 18, of a sixth variation of the first embodiment of the present embodiment, FIG. 18 is a plan view of the film deposition apparatus according to the sixth variation in a state where the ceiling plate 11 of the vacuum chamber 1 is separated. The film deposition apparatus according to the present variation differs from the film deposition apparatus according to the first embodiment in that the second reaction gas supply part is provided on the upstream side of the conveyance port in the rotating direction of the turntable.

Different from the first embodiment in which the second reaction gas supply part is provided on the downstream side of the conveyance port in the rotating direction of the turntable, in the present variation, the second reaction gas supply part 32 is provided on the upstream side of the conveyance port 15 in the rotating direction of the turntable 2. According to this layout, the first reaction gas and the second reaction gas can be more efficiently separated from each other, and the first separation gas can be prevented from entering the first bottom surface part 45 and the second bottom surface part 45a. Thus, in the first bottom surface part 45 and the second bottom surface part 45a, each of the first reaction gas and the second reaction gas can be more efficiently supplied to a wafer.

Figure 19:
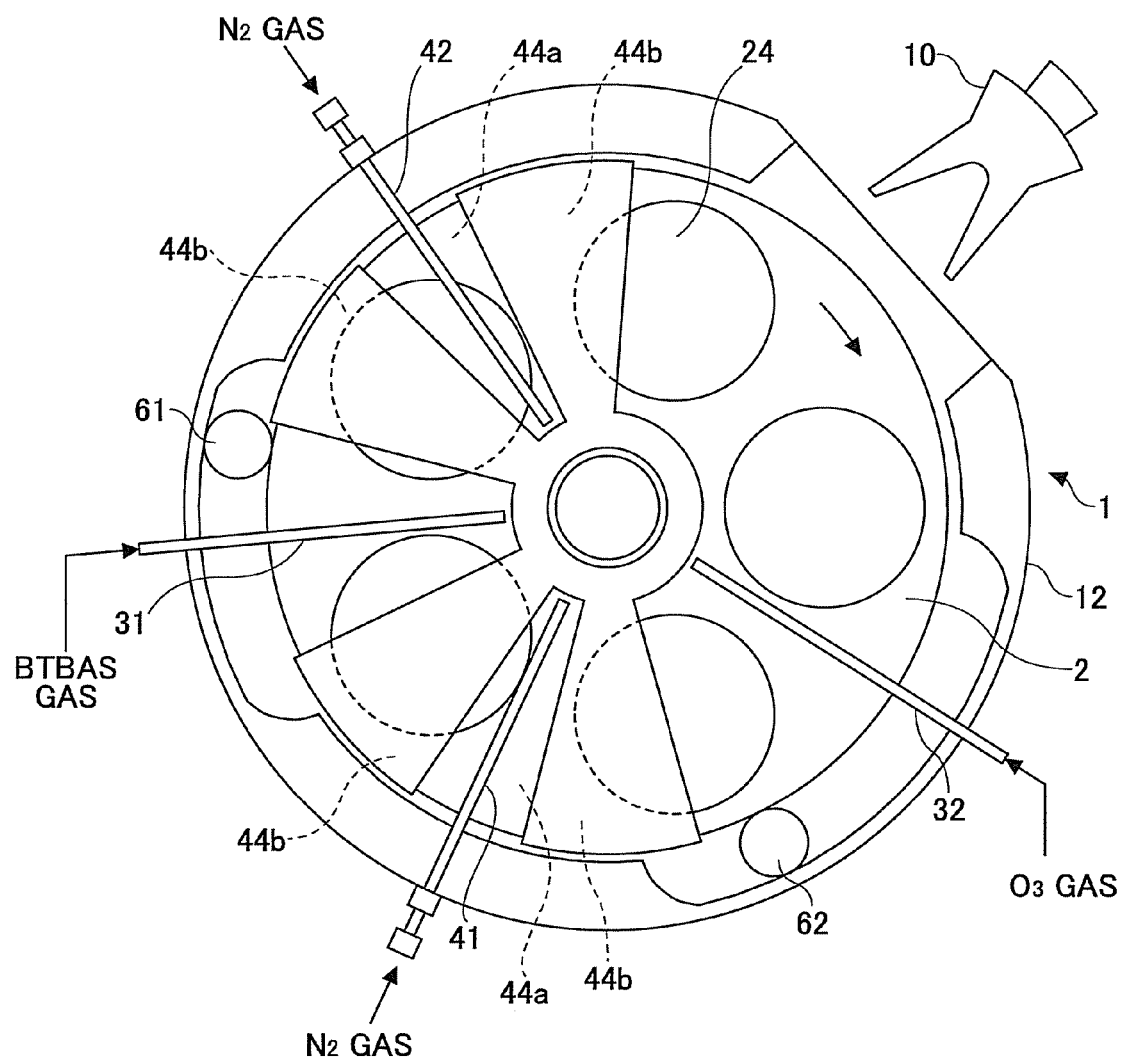
FIG. 19 is a plan view of a film deposition apparatus according to a seventh variation of the first embodiment of the present invention.

A description will be given, with reference to FIG. 19, of a film deposition apparatus according to a seventh variation of the first embodiment of the present invention. FIG. 19 is an illustration of a structure of the film deposition apparatus according to the seventh variation, and is a horizontal cross-sectional view of the ceiling plate 11 of the vacuum chamber 1 taken along a plane lower than the first bottom part 45 and the second bottom part 45a and higher than the first separation gas supply parts 41 and 42. The film deposition apparatus according to the present variation differs from the film deposition apparatus according to the first embodiment in that the third bottom surface part is divided into two pieces, and a first separation gas supply part is provided therebetween.

Different from the first embodiment in which a height from the turntable to the bottom surface of the ceiling plate is the same in the entire third bottom surface part, in the present variation, there are provided a third bottom surface part 44a, which contains the first separation gas supply parts 41 and 42 and is provided at a position higher than the height H3 from the turntable, and a third bottom surface part 44b, which is adjacent to the third bottom surface part 44a and is provided at a height H3 from the turntable. By providing the above-mentioned areas, the first reaction gas and the second reaction gas can be more efficiently separated from each other, and the first separation gas is prevented from entering the first bottom surface part 45 and the second bottom surface part 45a. Thus, the first reaction gas and the second reaction gas can be more efficiently supplied to a wafer in the first bottom surface part 45 and the second bottom surface part 45a. A distance between the third bottom surface part 44b and each of the first separation gas supply parts 41 and 42 and a shape and a size of the third bottom surface part 44b can be designed optimally in consideration of flow rates of the first reaction gas, the second reaction gas and the first separation gas.

Figure 20:
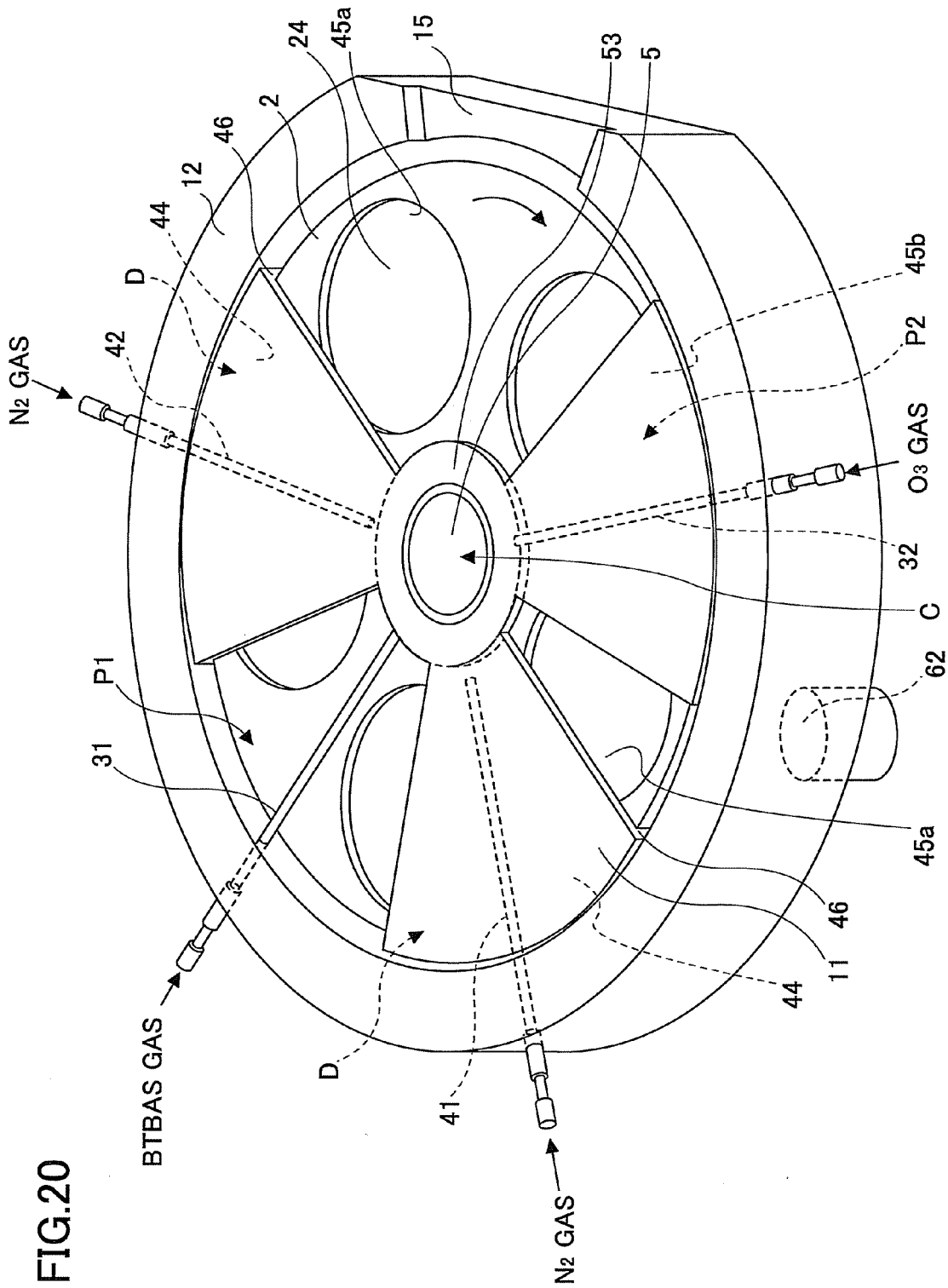
FIG. 20 is a perspective view of a film deposition apparatus according to an eighth variation of the first embodiment of the present invention.

A description will be given, with reference to FIG. 20, of a film deposition apparatus according to an eighth variation of the first embodiment of the present invention. FIG. 20 is a perspective view illustrating a structure of the film deposition apparatus according to the eighth variation. The film deposition apparatus according to the present variation differs from the film deposition apparatus according to the first embodiment in that a sixth bottom surface part and a seventh bottom surface part are provided instead of the second bottom surface part.

Different from the first embodiment in which a height from the turntable to the bottom surface of the ceiling plate of the vacuum chamber is uniform at all positions in the second bottom surface part, in the present variation, a sixth bottom surface part 45b and a seventh bottom surface part 45a are provided instead of the second bottom surface part. The sixth bottom surface part includes the second reaction gas supply part 32 and is located at a position lower than the second height H2 from the turntable 2. The seventh bottom surface part 45a is adjacent to the sixth bottom surface part 45b and is located at the second height H2 from the turntable 2. Accordingly, the sixth bottom surface part 45b has the same structure as the third bottom surface part 44 except that the second reaction gas supply part 32 is provided instead of the first separation gas supply part 41 or 42.

As mentioned above, by providing the sixth bottom surface part 45b, the first reaction gas and the second reaction gas can be more efficiently separated from each other, and the first separation gas and the first reaction gas are prevented from entering the sixth bottom surface. Accordingly, the second reaction gas can be more efficiently supplied to a wafer in the sixth bottom surface part 45b. The sixth bottom surface part 45b may have the same structure as one of the hollow third bottom surface parts 44 illustrated in FIG. 17A through FIG. 17C.

Although the sixth bottom surface part and the seventh bottom surface part are provided instead of the second bottom surface part in the present variation, a fourth bottom surface part and a fifth bottom surface part may be provided instead of the first reaction gas supply part. The fourth bottom surface part includes the first reaction gas supply part and is located at a position lower than the first height H1 from the turntable 2. The fifth bottom surface part is adjacent to the fourth bottom surface part and is located at the first height H1 from the turntable 2. By providing the fourth bottom surface part, the first reaction gas and the second reaction gas can be more efficiently separated from each other, and the first separation gas and the first reaction gas are prevented from entering the sixth bottom surface. Accordingly, the first reaction gas can be more efficiently supplied to a wafer in the fourth bottom surface part.

Figure 21:
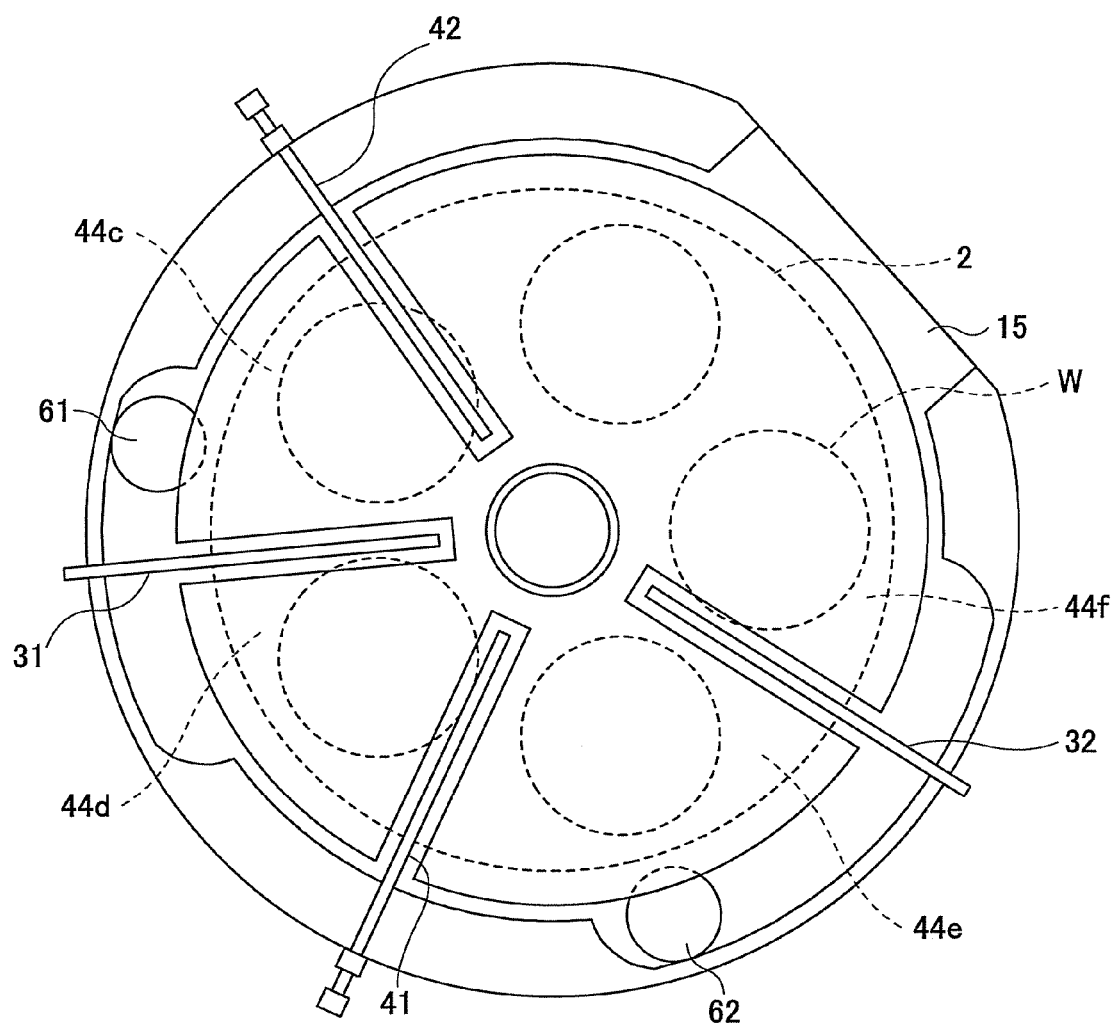
FIG. 21 is a plan view of a film deposition apparatus according to a ninth variation of the first embodiment of the present invention.

A description will be given, with reference to FIG. 21, of a film deposition apparatus according to a ninth variation of the first embodiment of the present invention. FIG. 21 is a plan view illustrating a structure of the film deposition apparatus according to the ninth variation in a state where the ceiling plate of the vacuum chamber is separated. The film deposition apparatus according to the present variation differs from the film deposition apparatus according to the first embodiment in that a low ceiling is provided on both sides of the first reaction gas supply part and the second reaction gas supply part.

Different from the first embodiment in which the third bottom surface part having the ceiling surface lower than the first bottom surface part and second bottom surface part to form a thin or narrow space on both sides of the first separation gas supply part, in the present variation, third bottom surface parts 44c through 44f, which have low ceiling surfaces the same as the third bottom surface part, are provided on both sides of the first reaction gas supply part 31 and the second reaction gas supply part 32, and these third bottom surface parts 44c through 44f are continuous.

In an entire area other than the area where the first separation gas supply part 41 (42), first reaction gas supply part 31 and the second reaction gas supply part 32 are provided, the third bottom surface part is provided. In a different viewpoint, this structure is an example in which the third bottom surface parts 44 on both sides of the first separation gas supply part 41 (42) are expanded to the first and second reaction gas supply part 31 and 32. In this case, the first separation gas diffuses on both sides of the first separation gas supply part 41 (42), and the first reaction gas and the second reaction gas diffuse on both sides of the first reaction gas supply part 31 and the second reaction gas supply part 32, respectively. The first separation gas and each of the first and second reaction gases join together in the thin or narrow space between the turntable 2 and each of the third bottom surface parts 44c through 44f. These gases are exhausted through the exhaust port 61 (62) located between the first (second) reaction gas supply part 31 (32) and the first separation gas supply part 42 (41). As mentioned above, the present variation can also provide the same effect as the first embodiment.

Figure 22:
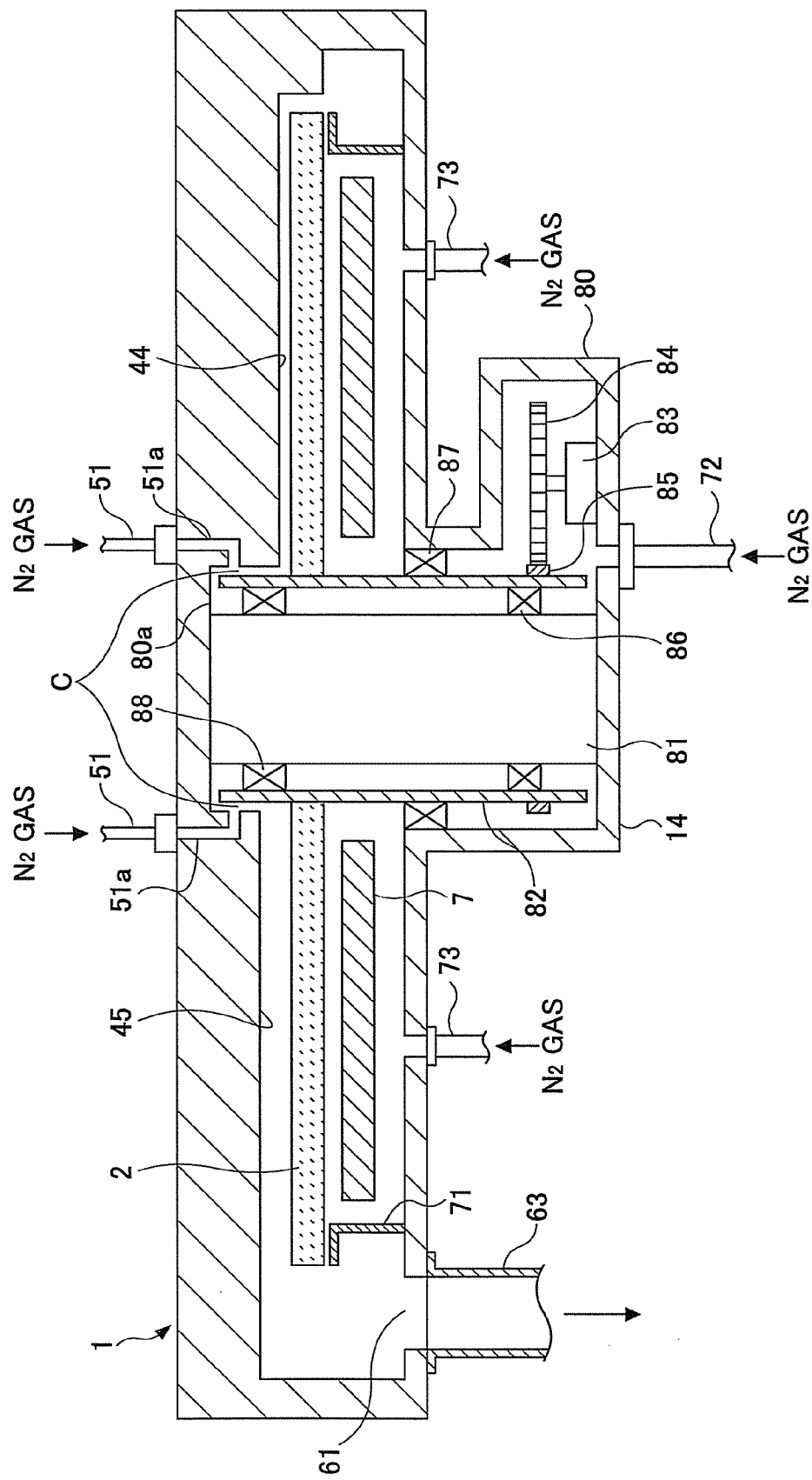
FIG. 22 is a cross-sectional view of a film deposition apparatus according to a tenth variation of the first embodiment of the present invention.

A description will be given, with reference to FIG. 22, of a film deposition apparatus according to a tenth variation of the first embodiment of the present invention. FIG. 22 is a cross-sectional view illustrating the film deposition apparatus according to the tenth variation. The film deposition apparatus according to the present variation differs from the film deposition apparatus according to the first embodiment in that a column is provided between the bottom part of the vacuum chamber and the ceiling in a central part of the vacuum chamber in order to prevent intermixture of the reaction gases.

Different from the first embodiment in which the rotation shaft of the turntable 2 is provided in the central part of the vacuum chamber 1 and the separation gas is purged to the space between the central part of the turntable 2 and the ceiling plate 11, in the present variation, a concave portion 80a is formed in a central area of a ceiling surface of the vacuum chamber 1 and a column 81 is provided between the concave portion 80a and a bottom part of an accommodation part 80. Because the bottom part 14 in a central area of the vacuum chamber 1 protrudes downward to form the accommodation part 80 for a drive part and the concave portion 80a is formed on the ceiling surface of the vacuum chamber 1 in the central area so that the column 81 is provided between the bottom part of the accommodation part 80 and a bottom surface of the concave portion 80a, the BTBAS gas from the first reaction gas supply part 31 and the O$_3$ gas from the second reaction gas supply part 32 are prevented from being mixed with each other.

As to a mechanism for rotating the turntable 2, a rotation sleeve 82 is provided to surround the column 81, and the turntable 21 having a ring shape is attached to an outer surface of the rotation sleeve 82. A drive gear part 84, which is driven by a motor 83, is provided in the accommodation part 80 so that the rotation sleeve 82 is rotated by the drive gear part 84. The rotation sleeve 82 is rotatably supported by bearing parts 86, 87 and 88. A third separation gas supply part 72 is connected to the bottom part of the accommodation part 80 to supply the third separation gas, and a separation gas supply part 51 is connected to a top part of the vacuum chamber 1 to supply the second separation gas to a space between a side surface of the concave portion 80a and an upper end part of the rotation sleeve 82. In FIG. 22, although two opening parts 51a for supplying the second separation gas to the space between the side surface of the concave portion 80a and the upper end part of the rotation sleeve 82 are illustrated on left and right sides, it is desirable to determine the number of opening parts 51a (the second separation gas supply parts 51) to prevent the BTBAS gas and the O$_3$ gas from being mixed with each other through an area adjacent to the rotation sleeve 82.

In the example illustrated in FIG. 22, when viewed from the side of the turntable 2, the space between the side surface of the concave portion 80a and the upper end part of the rotation sleeve 82 corresponds to the separation gas discharge hole, and the central part area C is defined by the separation gas discharge hole, the rotation sleeve 82 and the column 81.

Figure 23:
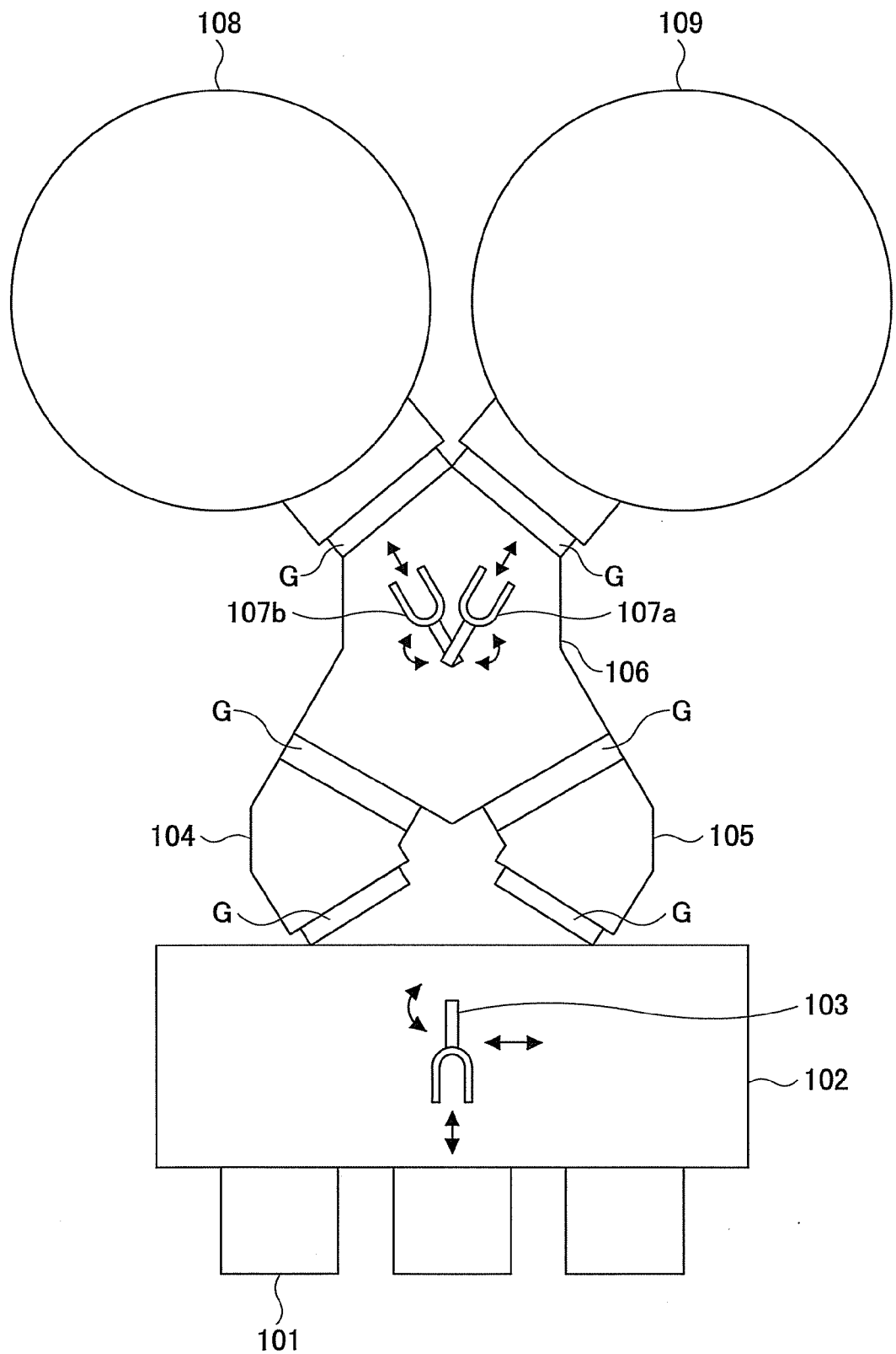
FIG. 23 is an illustrative plan view of a substrate processing apparatus according to a second embodiment of the present invention.

A description will be given, with reference to FIG. 23, of a substrate processing apparatus according to a second embodiment of the present invention. FIG. 23 is a plan view illustrating a structure of the substrate processing apparatus according to the second embodiment of the present invention.

As illustrated in FIG. 23, the substrate processing apparatus according to the present embodiment includes a conveyance container 101, an atmosphere conveyance chamber 102, a conveyance arm 103, load lock chambers 104 and 105 (corresponding to preliminary vacuum cambers in the present invention), a vacuum conveyance chamber 106, conveyance arms 107, and film deposition apparatuses 108 and 109. The conveyance container 101 is an enclosure type container referred to as FOUP, which accommodates, for example, 25 wafers. The conveyance arm 103 is situated inside the atmosphere conveyance chamber 102. An atmosphere in the load lock chambers 104 and 105 can be changed between an atmospheric pressure and a vacuum pressure. The two conveyance arms 107 are situated inside the vacuum conveyance chamber 106. Each of the film deposition apparatuses 108 and 109 is the film deposition apparatus according to the first embodiment of the present invention. The conveyance container 101 is conveyed from outside to a carry in/out port having a placement stage, which is not illustrated in the figure. After the conveyance container 101 is placed on the placement stage, a lid of the atmosphere conveyance chamber 102 is opened by an open-close mechanism, which is not illustrated in the figure, and a wafer is taken out of the conveyance container 101 by the conveyance arm 103. The wafer taken out of the conveyance container 101 is conveyed into the load lock chamber 104 or 105. Then, inside the load lock chamber 104 or 105 is changed to an atmospheric pressure to the vacuum pressure. Then, the wafer is taken out of the load lock chamber 104 or 105 by the conveyance arm 107, and is conveyed to the film deposition apparatus 108 or 109. Thereafter, a film deposition process is performed in the film deposition apparatus 108 or 109 according to the aforementioned film deposition method.

According to the present embodiment, because the substrate processing apparatus includes a plurality of film deposition apparatuses (for example, two film deposition apparatuses), each of which can process five wafers at a time, the film deposition process according to ALD or MLD can be performed at a high throughput.

Additionally, according to the present embodiment, because each of the film deposition apparatuses 108 and 109 is the film deposition apparatus according to the first embodiment of the present invention, the turntable does not generate slip or a loss of synchronism with respect to the motor. Thus, a substrate can be surely transferred between the vacuum chamber and an external part.

The present invention is not limited to the specifically disclosed embodiments, and variations and modifications may be made without departing from the scope of the present invention.

What is claimed is:

1. A film deposition apparatus for depositing a thin film on a substrate in a vacuum chamber by sequentially supplying at least two kinds of source gases that contains a first reaction gas and a second reaction gas and by carrying out a supply cycle to sequentially supply said at least two kinds of source gases, the film deposition apparatus comprising:
   a turntable rotatably provided in the chamber and having a substrate placement part on which a substrate is placed;
   a first reaction gas supply part and a second reaction gas supply part each of which extends from a position different from the other on a circumferential edge of said turntable toward a rotation center of said turntable in order to supply said first reaction gas and said second reaction gas, respectively;
   a first separation gas supply part extending from a position on the circumferential edge of said turntable between said first reaction gas supply part and said second reaction gas supply part toward the rotation center of said turntable in order to supply a first separation gas for separating said first reaction gas and said second reaction gas from each other;
   a first bottom surface area defined in a bottom surface of a ceiling plate of said vacuum chamber and containing said first reaction gas supply part, the first bottom surface area provided at a first height from said turntable;
   a first space formed between said first bottom surface area and said turntable;
   a second bottom surface area defined in the bottom surface of said ceiling plate of said vacuum chamber and containing said second reaction gas supply part, the second bottom surface area provided at a position separate from said first bottom surface area and at a second height from said turntable;
   a second space formed between said second bottom surface area and said turntable;
   a third bottom surface area defined in the bottom surface of said ceiling plate and containing said first separation gas supply part, said third bottom surface area positioned on both sides of said first separation gas supply part along a rotating direction of said turntable, said third bottom surface area provided at a third height from said turntable lower than said first height and said second height;
   a thin third space formed between said third bottom surface area and said turntable and having said third height so that said first separation gas supplied from said first separation gas supply part flows into said first space and said second space;
   a central part area defined in the bottom surface of said ceiling plate, said central part area being provided with a second separation gas supply part on a side of said substrate placement part with respect to the rotation center of said turntable, said second supply part supplying a second separation gas for separating said first reaction gas and said second reaction gas from each other;
   a first exhaust port configured to exhaust said first reaction gas and said second reaction gas together with said first separation gas discharged to both sides of said third space and said second separation gas discharged from said central part area; and
   a motor provided under a rotation shaft of said turntable to rotate said turntable,
   wherein said rotation shaft of said turntable is coupled to a drive shaft of said motor without slip.

2. The film deposition apparatus as claimed in claim 1, wherein a center of said rotation shaft of said turntable and a center of said drive shaft of said motor are aligned with each other, and said rotation shaft of said turntable and said drive shaft of said motor are coupled with each other without a displacement being generated in angular positions.

3. The film deposition apparatus as claimed in claim 1, further comprising a transmission apparatus configured to reduce a rotation speed of said motor using gears to transmit a drive power of said motor to said turntable.

4. The film deposition apparatus as claimed in claim 1, wherein said motor includes a servo motor.

5. The film deposition apparatus as claimed in claim 1, further comprising a third separation gas supply part under the rotation center of said turntable, the third separation gas supply part configured to supply a third separation gas for separating said first reaction gas and said second reaction gas from each other.

6. The film deposition apparatus as claimed in claim 1, further comprising a fourth separation gas supply part between a bottom surface of said vacuum chamber and said turntable, the fourth separation gas supply part configured to supply a fourth separation gas for separating said first reaction gas and said second reaction gas from each other.

7. The film deposition apparatus as claimed in claim 1, further comprising:
   a column extending between a bottom surface of said ceiling plate and a bottom surface of said vacuum chamber in a central part of said vacuum chamber; and
   a rotation sleeve configured to surround said column and rotatable about a vertical axis,
   wherein said rotation sleeve serves as said rotation shaft of said turntable.

8. The film deposition apparatus as claimed in claim 1, wherein a surface of said substrate placed on said substrate placement part is at the same level as a surface of said turntable or said surface of said substrate is lower than said surface of said turntable.

9. The film deposition apparatus as claimed in claim 1, wherein gas introducing ports are provided on a side of rotation center or a side of circumferential edge of said turntable to introduce the first and second reaction gases and the first separation gas to said first reaction gas supply part, said second reaction gas supply part and said first separation gas supply part.

10. The film deposition apparatus as claimed in claim 1, wherein said first separation gas supply part is provided with discharge holes arranged from a rotation center side of said turntable toward a circumferential edge side of said turntable.

11. The film deposition apparatus as claimed in claim 10, wherein said first separation gas supply part is located in a middle of the third bottom surface area so as to divide the third bottom surface area into two areas, and wherein each of the two areas has a width of 50 mm in the rotating direction of said turntable.

12. The film deposition apparatus as claimed in claim 1, further comprising a second exhaust port and a third exhaust port provided adjacent to said first space and said second space and along a circumferential edge of a bottom surface of said vacuum chamber.

13. The film deposition apparatus as claimed in claim 1, wherein a pressure in said third space is higher than a pressure in said first space and said second space.

14. The film deposition apparatus as claimed in claim 1, further comprising a heating part under said turntable to heat said turntable.

15. The film deposition apparatus as claimed in claim 1, further comprising a conveyance port provided on a side surface of said vacuum chamber, said conveyance port configured to be opened and closed by a gate valve to carry said substrate in or out of said vacuum chamber.

16. The film deposition apparatus as claimed in claim 1, wherein said third bottom surface area has a shape having a width increased from a rotation center of said turntable toward a circumferential edge of said turntable.

17. The film deposition apparatus as claimed in claim 1, wherein said third bottom surface area has a sectoral shape in a plane view.

18. A substrate processing apparatus comprising:
- a film deposition apparatus as claimed in claim 1;
- a vacuum conveyance chamber airtightly connected to said film deposition apparatus and provided with a substrate conveyance part therein; and
- a preliminary vacuum chamber airtightly connected to said vacuum transportation chamber, a pressure inside said preliminary vacuum chamber being changed between an atmospheric pressure and a vacuum pressure.

* * * * *